United States Patent
Saeki

(10) Patent No.: US 6,545,518 B2
(45) Date of Patent: Apr. 8, 2003

(54) TIMING DIFFERENCE DIVISION CIRCUIT AND SIGNAL CONTROLLING METHOD AND APPARATUS

(75) Inventor: Takanori Saeki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/864,735

(22) Filed: May 24, 2001

(65) Prior Publication Data

US 2001/0045853 A1 Nov. 29, 2001

(30) Foreign Application Priority Data

May 26, 2000 (JP) ........................................ 2000-157167

(51) Int. Cl.$^7$ ............................................... H03B 19/00
(52) U.S. Cl. ........................ 327/116; 327/408; 327/119
(58) Field of Search ................................. 327/119, 116, 327/407, 408, 379, 172, 2

(56) References Cited

U.S. PATENT DOCUMENTS

| | | | | |
|---|---|---|---|---|
| 4,424,456 A | * | 1/1984 | Shiraki et al. ............... | 327/111 |
| 5,327,031 A | | 7/1994 | Marbot et al. ............... | 327/261 |
| 5,442,835 A | | 8/1995 | Walker et al. ................. | 19/95 |
| 5,530,837 A | | 6/1996 | Williams et al. ............. | 395/434 |
| 5,563,539 A | * | 10/1996 | Takase ........................ | 327/185 |
| 6,052,004 A | | 4/2000 | Saeki ........................... | 327/116 |
| 6,396,320 B2 | * | 5/2002 | Saeki ........................... | 327/156 |

FOREIGN PATENT DOCUMENTS

| | | |
|---|---|---|
| EP | 0 865 160 A2 | 9/1998 |
| EP | 0 884 732 A2 | 12/1998 |
| GB | 2 321 144 A | 7/1998 |
| JP | 11-4145 | 1/1999 |
| JP | 11-4146 | 1/1999 |

OTHER PUBLICATIONS

Shimizu et al, A Multimedia 32b RISC Microprocessor with 16Mb DRAM, IEEE International Solid State Circuits Conference, 1996, pp 216–217, 448.
Combes M. et al: "A Portable Clock Multiplier Generator Using Digital CMOS Standard Cells" IEEE Journal of Solid–State Circuits, US, IEEE Inc. New York, vol. 31 ,No. 7, Jul. 1, 1996, pp. 958–965, XP00063282 ISSN. 0018–9200.

* cited by examiner

Primary Examiner—Dinh T. Le
(74) Attorney, Agent, or Firm—Hayes Soloway P.C.

(57) ABSTRACT

Timing difference division circuit with a high operating speed and a small area, assuring broadband operation. The circuit includes a logic circuit L1 generating a first gate signal and a second gate signal based on a first input signal and a second input signal, a first switch element connected across a first power source and an inner node and having a control terminal to which is fed the first gate signal, a first series circuit made up of a second switch element and a first constant current source and a second series circuit made up of a third switch element and a second constant current source. The first and second series circuits are connected in parallel across the inner node and the second power source. The first and second gate signals are connected to control terminals of the second and third switches, respectively. The circuit also includes a plurality of MOS capacitors, connection of which to the inner node is separately controlled by a control signal, and a buffer circuit an input end of which is connected to the inner node and the value of an output signal of which is determined based on the relative magnitude of the potential of the inner node and a threshold voltage. An overlap period during which the first and second gate signals output from the logic circuit are both activated to turn on the second and third switch elements is set to an optional value.

24 Claims, 29 Drawing Sheets

TMD IN-PHASE INPUT (TIME DIFFERENCE INPUT)

FIG. 27(a)
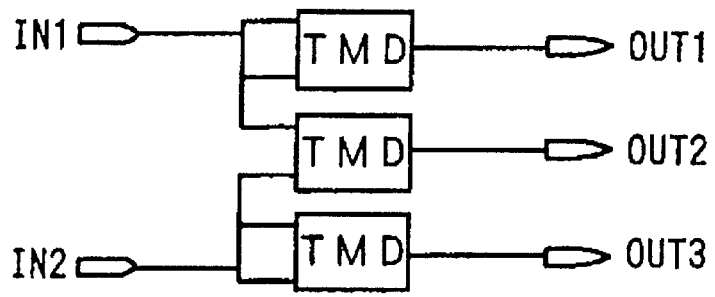
FIG. 27(b)
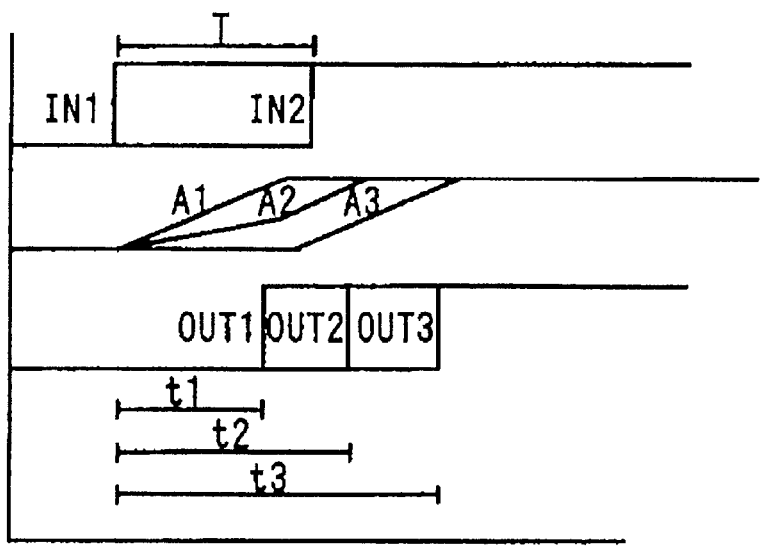
FIG. 27(c)
$t1 = CV/2I$
$t2 = T + (CV - IT)/2I$
$t2 = (1/2)T + t1$
$t3 = T + CV/2I = T + t1$

TIMING DIFFERENCE DIVISION CIRCUIT AND SIGNAL CONTROLLING METHOD AND APPARATUS

FIELD OF THE INVENTION

This invention relates to a signal controlling method and apparatus.

BACKGROUND OF THE INVENTION

A conventional signal dividing method for dividing (internally dividing or interpolating) a timing difference is used for multiplying the frequency of clock signals, as disclosed in Publication 1 (Japanese patent application 09-157028 (JP Patent Kokai JP-A-11-4145)).

In e.g., Publication 2 (ISSCC Digest of Technical Papers pp.216 to 217, February 1996, U.S. Pat. Nos. 5,442,835 and 5,530,837), there is disclosed a clock signal frequency multiplying circuit, as shown herein in FIG. 24.

Referring to FIG. 24, the clock signal frequency multiplying circuit is made up of four sets of delay circuits 301 to 304, a phase comparator 309 and a counter 310, in case of 4× frequency multiplying.

Each of the first to fourth delay circuits 301 to 304 has its output terminals selected by first to fourth switchers 305 to 308, with the first to fourth delay circuits 301 to 304 being connected in series with one another.

A first clock 311, input from outside to the first delay circuit 301, is compared in the phase comparator 309 with a fifth clock 315 passed through the first to fourth delay circuits 301 to 304. An UP signal 316 or a DOWN signal 317 is transferred to the counter 310, based on the results of comparison, and a control signal 318 is output from the counter 310 to the first to fourth switchers 305 to 308 to make adjustment so that the first clock 311 will be of the same phase (in-phase) to the fifth clock 315.

Since the four delay circuits 301 to 304 are adjusted equally in delay time, the delay time is equal, with the timing difference of the first to fourth clocks 311 to 314 being equal to one another at one-fourth of the clock period tCK.

Thus, by synthesising the first to fourth clocks 311 to 314, 4× clocks are produced.

As a circuit for multiplying the frequency of clock signals, a phase locked loop (PLL) is used. In the PLL, shown in FIG. 25, an output of a voltage-controlled oscillator VCO 322 is frequency-divided by a frequency divider 323, and the resulting signal is compared by a phase comparator 319 to an external clock 324. The result of comparison is input as an UP signal 325 or a DOWN signal 326 via a charging pump 320 and a loop filter 321 to the VCO322 to control the VCO 322 so that clocks obtained on frequency-dividing the output of the VCO 322 will be of a frequency equal to a frequency of the external clock 324. This causes the VCO 322 to output frequency-multiplied clocks 327 with the number of times of multiplying equal to a reciprocal of the number of times of frequency division.

However, the circuit shown in FIG. 24 is such a circuit comparing a signal which has traversed the series-connected delay circuits to external clocks approximately several tens of times to correct the delay difference and the phase difference progressively as comparison proceeds.

On the other hand, the PLL circuit, shown in FIG. 25, has a drawback that it is insufficient in operating speed, since clocks obtained on frequency division of the output of the VCO 322 will be of a frequency equal to the frequency of the external clock 324, such that a time interval not less than several tens of clock periods must elapse until the clocks multiplied in frequency are obtained.

The circuits shown in FIGS. 24 and 25 basically can be used only for clock control, while it cannot be used as a delay circuit for varying the degree of signal delay.

With a view to solving these drawbacks and to realizing a method and apparatus for controlling the clock signals also usable as a variable delay circuit, the present inventors have proposed the following circuit configuration in the JP-A-11-4145. The clock control circuit, described in JP-A-11-4145, is now explained by referring to the drawings, the entire disclosure of which is herein incorporated by reference thereto.

FIG. 4 shows the configuration of the JP-A-11-4145. The circuit shown in FIG. 4 multiplies the frequency of external clocks. Specifically, the circuit shown in FIG. 4 frequency divides external clocks 1 into multi-phase clocks 3 and divides the input timing difference of different phase pulse edges of the multi-phase clocks 3 or multiplexes the clocks 9c of different phases resulting from the division to multiply the phases of the external clock 1. The circuit shown in FIG. 4 includes a frequency divider 2, a multi-phase clock frequency multiplying circuit 5 and a clock synthesis circuit 8. The frequency divider 2 divides the frequency of the external clock 1 to the multi-phase clocks 3. A multi-phase clock multiplying circuit 5 includes a timing difference dividing circuit 4a for dividing pulses of different phases of different phase clocks of the multi-phase clocks 3, timing difference dividing circuits 4a for dividing the pulses of the same phase by n and a multiplying circuit 4b for multiplying different phase pulses resulting from division by n, and outputs multi-phase clocks 9a.

The clock synthesis circuit 8 synthesises the multi-phase clocks 9a, output from the multiplying circuit 4b, to generate single-phase clocks 9. The timing difference dividing circuits 4a are connected in parallel with one another.

The external clocks 1 are frequency divided by the frequency divider 2 into the multi-phase clocks 3, and the input timing difference of different phase pulse edges of the frequency divided multi-phase clocks 3 is divided by a timing difference dividing circuit 4a. The resulting clocks 9c of different phases, obtained on frequency division, are multiplexed to multiply the external clock 1, to multiply the phases of the multi-phase clocks.

FIG. 5 shows an illustrative structure of a two-phase clock multiplying circuit as the multi-phase clock frequency multiplying circuit 5. The two-phase clock multiplying circuit divides the frequency of the external clocks 105 by two to output two-phase clocks having the double (2×) frequency.

In FIG. 5, a frequency divider 101 divides the frequency of the external clocks 105 by two to generate two-phase clocks D1, D2. Plural two-phase clock multiplying circuits $102_1$ to $102_n$ divide the input timing difference of different phase pulse edges of the frequency divided multi-phase clocks D1, D2 (3 of FIG. 4), the first stage two-phase clock multiplying circuit $102_1$ generates two-phase clock signals D11, D12 obtained on frequency doubling the two-phase clocks D1, D2 from the frequency divider 101. In similar manner, the two-phase clock multiplying circuits $102_1$, $102_3$ to $102_{n-1}$ each doubles the frequency of the clocks D21, D22 of the previous stage so that two-phase clocks Dn1, Dn2 obtained on 2nX-multiplying the external clocks 105 are obtained by the two phase clock multiplying circuit $102_n$ of the last stage.

A clock synthesis circuit 103 synthesises 2nX-multiplied two-phase clocks Dn1, Dn2 output from the last stage two phase clock multiplying circuit $102_n$ to output multiplied clocks 107.

A period detection circuit 104 (6 of FIG. 4) is fed as an input with the external clocks 105 to output a control signal 106 (7 of FIG. 4) to each two-phase clock multiplying circuits $102_1$ to $102_n$. The control signal 106 corrects the clock period dependency of the timing difference dividing circuit contained in each two-phase clock multiplying circuits $102_1$ to $102_n$ for load adjustment.

The period detection circuit 104 is made up of a ring oscillator of a fixed number of stages and counters and counts the number of oscillations of the ring oscillators during the period of the external clocks 105 to output a control signal 105 depending on the number of counts.

The two-phase clock multiplying circuits $102_1$ to $102_n$ are freed of fluctuations in characteristics by the control signal 106 from the period detection circuit 104.

The circuit shown in FIG. 5 divides the frequency of the external clocks 105 by a ½ frequency divider 101 and doubles the frequency of the clocks D1, D2 by the initial state two-phase clock multiplying circuit $102_1$ to generate two-phase clocks D11, D12. The similar process is repeatedly carried out in the two-phase clock multiplying circuits $102_2$ to $102_n$ until 2nX two-phase clocks Dn1, Dn2 are ultimately obtained from the last stage two-phase clock multiplying circuits $102_n$.

These clocks Dn1, Dn2 are synthesised by the clock synthesis circuit 103 to produce multiplied clocks 107.

In the embodiment shown in FIG. 6, in which n=4, the multiplied clocks 107 are of the same clock period as that of the external clocks 105 and are obtained as signals 2nX (8X) from the external clocks 105. Meanwhile, n=4 is merely illustrative such that n may be set to any suitable integer.

FIG. 7 shows a structure of the two-phase clock multiplying circuit 5. Since the two-phase clock multiplying circuits $102_1$ to $102_n$ are of the same structure, the following explanation is directed to the last stage two-phase clock multiplying circuits $102_n$. The structure of the two-phase clock multiplying circuits $102_n$ is designed for the setting of n=4.

The two-phase clock multiplying circuit $102_n$ includes parallel-connected first to fourth timing difference dividing circuits 108 to 111 and first and second multiplexing circuits 112, 113. Two phase clocks D (n−1) 1, D (n−1) 2 are input to two input ends of the first to fourth timing difference dividing circuits 108 to 111. The control signal 106 and four phase clocks P1 to P4 from the timing difference dividing circuits 108 to 111 in the complementary configuration are fed back to the input side.

The first and second multiplexing circuits 112, 113 are fed with and multiplex two-phase clocks P1, P3 and P2, P4 from the first to fourth timing difference dividing circuits 108 to 111 to generate two-phase clocks Dn1, Dn2.

The operation of the two-phase clock multiplying circuit, shown in FIG. 7, is explained with reference to FIG. 8.

The two-phase clock multiplying circuit $102_n$ is fed with two-phase clocks D (n−1) 1 and D (n−1) 2 from the previous stage and with the control signal 106 from the period detection circuit 104 to output frequency doubled two-phase clocks Dn1, Dn2.

In the two-phase clock multiplying circuit $102_n$, the two-phase clocks D (n−1) 1 and D (n−1) 2 and the control signal 106 are input to the totality of the four timing difference dividing circuits 108 to 111. The clocks P1 to P4 are output from the four timing difference dividing circuits 108 to 111 so as to be fed back as inputs to the associated timing difference dividing circuits 108 to 111.

Referring to FIG. 8, the rising of the clock P1 is determined by the delay corresponding to the inner time delay of the timing difference dividing circuit 108 as from the rising of the clock D (n−1) 1.

The rising of the clock P2 is determined by the division of the timing difference between the rising of the clock D (n−1) 1 and that of the two-phase clock D (n−1) 2 and the delay corresponding to the internal delay.

The rising of the clock P3 is determined by the delay corresponding to the internal delay as from the clock D (n−1) 2. The rising of the clock P4 is determined by the division of the timing difference between the rising of the clock D (n−1) 2 and that of the clock D (n−1) 1 and the delay corresponding to the internal delay as from the clock D (n−1) 2.

The clock P2 controls the decay (falling) of the clock P1 input to the timing difference dividing circuit 108. The clock P3 controls the decay of the clock P2 input to the timing difference dividing circuit 109. The clock P4 controls the decay of the clock P3 input to the timing difference dividing circuit 110. The clock P1 controls the decay of the clock P4 input to the timing difference dividing circuit 111.

So, the periods of the clocks P1 to P4 are equal to those of the clocks D (n−1) 1 and D (n−1) 2 such that the clocks P1 to P4 become substantially four-phase signals with a 25% duty.

Moreover, the clocks P1, P3 are input to and multiplexed by the multiplexing circuit 112 so as to be output as a clock signal Dn1.

The clocks P2, P4 are input to and multiplexed by the multiplexing circuit 113 so as to be output as a clock signal Dn2.

The clocks Dn1, Dn2 are two-phase clocks with subsequently 50% duty, with the periods thereof being one-half those of the clocks D (n−1) 1 and D (n−1) 2.

Referring to FIGS. 9 to 12, typical structures of the timing difference dividing circuits 108 to 111, shown in FIG. 7, are explained. In FIGS. 9 to 12, MP11, MP21, MP31 and MP41 are P-channel MOS transistors, MN11 to MN19, MN21 to MN29, MN31 to MN39 and MN41 to MN49 are N-channel MOS transistors, while CAP11 to CAP 13, CAP21 to CAP23, CAP31 to CAP33 and CAP41 to CAP43 are capacitance devices.

The timing difference dividing circuits 108 to 111 are of the identical device structure. That is, each of the difference dividing circuits 108 to 111 is made up of a two-input NAND 10, an inverter 11, a sole P-channel MOS transistor MP11 etc., three sets each of two-series connected N-channel MOS transistors, three sets each of a series-connected N-channel MOS transistor and a capacitance device. The three NAND transistors are all of an identical gate width, with the gate width of the three sets of NMOS transistors and the capacitance of the capacitance device being of a size ratio of 1:2:4.

The difference dividing circuits 108 to 111, shown in FIGS. 9 and 11, are similar in structure, with the difference being the connection of inputs D (n−1) 1 and D (n−2) 2 and the connection of the input P2 (P4).

Referring to FIG. 9, the timing difference division circuit 108 includes a NAND circuit NAND11, having a signal D (n−1) 2 and a signal P2 as inputs, a P-channel MOS transistor MP11 having a source, a gate and a drain connected to a power source VCC, to an output end (node 11) of the NAND11 and to an internal node N12, respectively, N-channel MOS transistors MN12, MN13 each having a drain and a gate connected to the inner node N12 and to a signal D (n–1) 1, respectively, a N-channel MOS transistor MN11 having a gate connected to ground potential, and N-channel MOS transistors MN14, MN15 and MN16, having sources commonly connected to the ground potential GND and gates commonly connected to an output end of NAD 11. The inner node N12 is connected to an input end of an inverter INV11 to output a signal P1 at an output terminal of the inverter INV11. The inner node N12 is provided with N-channel MOS transistors MN17, MN18 and MN19, having drains commonly connected and having gates connected to a control signal 106, and with capacitances CAP11, CAP12 and CAP13, having one end connected to a source of N-channel MOS transistors MN17, MN18 and MN19 and having the other ends commonly connected to the ground potential.

Referring to FIG. 10, a timing differential circuit 109 include a NAND circuit NAND 21, fed with a signal D (n–1) 2 and with a signal P3 as inputs, a P-channel MOS transistor MP21, having a source, a gate and a drain connected to the power source VCC, to an output end (node N21) of the NAND21 and to the inner node N22, respectively, an N-channel MOS transistor MN21 having a drain and a gate connected to the inner node N22 and to the signal D (n–1) 1, respectively, N-channel MOS transistors MN22 and MN23, having drains and gates connected commonly to the inner node N22 and to the signal D(n–1)2, respectively, and N-channel MOS transistors MN24, MN25 and MN26 having sources commonly connected to the ground potential GND and gates commonly connected to an output end (node N21) of the NAND21. The inner node N22 is connected to the input end of the inverter INV21 to output a signal P3 at an output end of the inverter INV21. The inner node N22 includes N-channel MOS transistors MN27, MN28 and MN29 having drains commonly connected and having gates connected to a control signal 106, and capacitances CAP21, CAP22 and CAP23 having one ends connected to sources of N-channel MOS transistors MN27, Mn28 and MN29 and having the other ends commonly connected to the ground potential.

Referring to FIG. 11, a timing difference division circuit 110 includes a NAND circuit NAND31, fed with the signal D (n–1) 1 and with a signal P4, as input, a P-channel MOS transistor MP31 having a source, a gate and a drain connected to the power source VCC, to an output end of the NAND31 and to an inner node N32, respectively, N-channel transistors MN32, MN33, having drains commonly connected to the inner node N32 and having gates commonly connected to the signal D (n–1) 2, a N-channel MOS transistor MN31 having a gate connected to the ground potential, and N-channel MOS transistors Mn34, MN35 and MN36 having sources commonly connected to the ground potential GND and having gates commonly connected to the output end of the NAND31. The inner node N32 is connected to the input end of the inverter INV31 and outputs a signal P3 at an output end of the inverter INV31. The inner node N32 includes N-channel MOS transistors MN37, MN38 and MN39 having drains commonly connected and having gates connected to control signals, and capacitances CAP31, CAP32 and CAP33 having one ends to sources of N-channel MOS transistors MN37, MN38 and Mn39 and having the other ends commonly connected to the ground potential.

Referring to FIG. 12, a timing difference division circuit 111 includes a NAND circuit NAND41, fed with the signal D (n–1) 1 and with the signal P1, a P-channel MOS transistor MP41 having a source, a drain and a gate connected to the power source VCC, to an output end (node N41) of the NAND41 and to an inner node N42, respectively, an N-channel MOS transistor MN41 having a drain and a gate connected to the internal node N42 and to the signal D (n–1) 2, N-channel MOS transistors MN42, MN43 having drains and gates commonly connected to the inner node N42 and connected to the signal D(n–1)1, respectively, and N-channel MOS transistors MN44, MN45 and MN46 having sources and gates commonly connected to the ground potential GND and commonly connected to an output end of the NAND41, respectively. The inner node N41 is connected to an input end of the inverter INV41 and outputs a signal P4 at an output end of the inverter INV41. The inner node N42 includes N-channel MOS transistors MN47, MN48 and MN49, having drains commonly connected and also having gates connected to a control signal, and capacitances CAP41, CAP42 and CAP43, having one ends connected to the sources of the N-channel MOS transistors MN47, MN48 and MN49 and having the other ends commonly connected to the ground potential.

The operation of the timing difference division circuits 108 to 111 is explained by referring to the timing waveform diagram of FIG. 13. The timing difference division circuits 108, 110, shown in FIGS. 9 and 11, are of the same circuit configuration except input/output signal, while the timing difference division circuits 109, 111 shown in FIGS. 10 and 12 are of the same circuit configuration except the input/output signals. So, the operation of the timing difference division circuits 108, 109, shown in FIGS. 9 and 10 are hereinafter explained.

As for the inner operation of the timing difference division circuit 108, shown in FIG. 9, one period is from t1 until t3 in FIG. 13. So, the inner node waveform for this one period duration is shown.

First, the rise timing of the clocks P1 is explained.

By a rising edge of a clock D (n–1) 1, electrical charges at the node N12 are extracted to the N-channel MOS transistors MN12, MN13. When the potential of the node N12 has reached a threshold value of the inverter INV11, there rises an edge of the clock P1, output from the inverter INV11.

If the electrical charges of the internal node N12 that need to be extracted until reaching the threshold value of the inverter INV11 are denoted CV and charge-extracting current values of the N-channel MOS transistors MN12 and MN13 are denoted I, the result of extraction of the electrical charges of CV from the clock D (n–1) 1 with the current of 2I, that is CV/2I, represents the timing as from the rising edge of the clock D (n–1) 1 until rising of the clock P1.

The decay of clocks P1 is by the output of the two-input NAND 11 going low to turn ON the P-channel MOS transistor MP11 to charge the inner node N12 to a high level. The two-input NAND 11 is fed with a clock D (n–1) 2 and a clock P2, with the output going low when both the clock D (n–1) 2 and the clock P2 are high. The period during which the clock P2 is high is comprised within a period during which the clock D (n–1) 2 is high, so that the output clock is of a pattern corresponding to a pattern of the inverted clock P2. However, during the time an initial value of the clock P2 is not fixed with the power being turned on, a logical value is taken of the clock P2 and the clock D (n–1) 2.

As for the operation of the timing difference division circuit 109, shown in FIG. 10, there is shown the internal node waveform during the time period as from t1 until t3 in FIG. 13, because this time period corresponds to one period.

The rise timing of the clock P2 is explained. During the time period tCKn as from the rising edge of the clock D (n−1) 1, the electrical charges of the node N22 are extracted by the N-channel MOS transistor MN21. After time tCKn, the residual electrical charges at the node N22 are extracted from the rising edge of the clock D (n−1) 2 by the N-channel MOS transistors MN22, MN23. When the potential of the node N22 reaches the threshold value of the inverter INV21, the edge of the clock P2 rises. If the electrical charges of the node N22 are denoted CV, and the charge extracting current values of the N-channel MOS transistors MN22, MN23 are denoted I, the result of extracting the current CV from the clock D (n−1) 1 during the time period tCKn with the current I, and during the remaining period with 2I, that is $$tCKn+(CV-tCK\cdot I)/2I=CV+tCKn/2$$

represents the timing as from the rising edge of the clock D(n−1) 1 until the rising of the clock P2.

Therefore, the timing difference with respect to the rising of the clock P1 is just equal to tCKn/2.

The decay timing of the clock P2 is caused by an output of the two-input NAND 21 going low to turn the P-channel MOS transistor MP21 on to charge the node N22 to high. The output of the two-input NAND 21 goes low only when a clock D (n−1) 2 and a clock P3 are fed as inputs and both the clock D (n−1) 2 and the clock P3 are high.

The clocks P3 and P4 are now explained. Since the timing difference between the rising edge of the clock D (n−1) 1 and that of the clock D (n−1) 2 is tCKn, the rise timing difference between the clocks P1 and P3 is tCKn. So, the rising timing difference between the clocks P2 and P3 is also ½tCKn. Similarly, the rising timing difference between clocks P3 and P4 and that between clocks P4 and P1 are also ½tCKn.

Therefore, the clocks P1 to P4 are four-phase signals of 25% duty, as mentioned previously.

The clocks P1 and P3 and the clocks P2 and P4 are respectively multiplexed by multiplexing circuits 112, 113, each being comprised of a NOR circuit NOR12 and an inverter INV13, shown in FIG. 14, and become two-phase clock signals of 50% duty.

In order for the rising of the clock P2 to be ½tCKn for the rising of the clock P1, the condition that the threshold value of the inverter INV21 be not reached even when electrical charges of the node N22 are extracted by the N-channel MOS transistor MN21 during the period of tCKn, that is the condition of $$CV-tCKn\cdot I>0$$

need to be met.

However, tCKn is not previously determined by the period of the external clock 1 at the time of designing, so that the current I is fluctuated with device characteristics.

Therefore, in order to cope with this, the CV value is varied depending on the period of the external clock 105 and with device characteristics.

The gates of the N-channel MOS transistors, connected to the capacitance device (MN17 to MN19 in FIG. 9), are fed with a control signal 106, as explained previously, such that the load of the common node N12 can be varied with the control signal 106.

Since the N-channel MOS transistors and the capacitance devices are set to the size ratio of 1:2:4, eight-stage adjustment is possible.

The control signal 106 is a value corresponding to the count value of the number of times of oscillations of the ring oscillator, obtained by a counter, during a period of the external clock 105, in a period detection circuit 104. In this circuit configuration, since the relation between the period of the external clocks and the period of the ring oscillator representative of device characteristics is coded, not only is the operating range not increased relative to the period of the external clocks 1, but also variations in the device characteristics are resolved.

In the present conventional structure, two-phase clock multiplying circuits $102_1$ to $102_n$ are connected in series, with the frequency of the respective input clocks D1, D to D (n−1) 1 and D (n−1) 2 increasing at a factor of two, so that the capacitance value is adjusted between the two-phase clock multiplying circuits $102_1$ to $102_n$ in order to optimise the CV value.

In the conventional circuit, described above, multiplied clocks can be generated by dividing the frequency of the external clocks 1 by two to generate two-phase clocks without using feedback circuits, such as PLL or DLL.

FIG. 15 shows a circuit configuration explained as the second embodiment in the JP-A-11-4145 and including a ¼ frequency divider 201, series-connected four-phase clock multiplying circuits $202_1$ to $202_n$, a clock synthesis circuit 203 and a period detection circuit 204.

The operation of the circuit shown in FIG. 15 is explained with reference to the timing diagram of FIG. 16. This circuit divides the external clock signals 205 by the ¼ frequency divider 201 to generate four-phase clocks Q1 to Q4 which are frequency-doubled by a four-phase clock multiplying circuit 202, to generate four-phase clocks Q11 to Q14. The similar process is repeated up to four-phase clock multiplying circuits $202_1$ to $202_n$ to generate four-phase clocks Q1 to Q4 frequency multiplied by a factor of 2n. These clocks are synthesised by a clock synthesis circuit 203 to generate multiplied clocks 207.

The period detection circuit 204 is made up of a fixed number of steps of ring oscillators and counters. Specifically, the number of times of oscillations of the ring oscillator during the period of the external clocks 205 is counted by a counter, and a control signal 206 is generated depending on the count value to adjust the load in the four-phase clock multiplying circuits $202_1$ to $202_n$. By the period detection circuit 204, the operating range of the external clocks of the circuit and variations in the device characteristics may be resolved.

Referring to FIG. 17, the structure of the four-phase clock multiplying circuit 202 is explained. The four-phase clock multiplying circuits $202_1$ to $202_n$ are of the same configuration. Referring to FIG. 17, the four-phase clock multiplying circuit $202_n$ is made up of eight timing difference division circuits 208 to 215, eight pulse width correction circuits 216 to 223 and four multiplexing circuits 224 to 227.

The inner structures of the eight timing difference division circuits 208 to 215, eight pulse width correction circuits 216 to 223 and four multiplexing circuits 224 to 227 will be explained subsequently.

Referring to FIGS. 17 and 18, the internal connection and operation of the four-phase clock multiplying circuit $202_n$ are hereinafter explained. The four-phase clock multiplying circuit 202, is fed with four-phase clocks Q (n−1) 1 to Q (n−1) 4 and a control signal 206 from the period detection circuit 204 to output frequency doubled four-phase clocks Qn1 to Qn4.

In the four-phase clock multiplying circuit 202,, the control signal 206 is input to the eight timing difference division circuits 208 to 215. The clocks Q (n−1) to D (n−1) 4 are input to the timing difference division circuits 208, 210, 212, 214, one signal at a time, while being input to the timing difference division circuits 209, 211, 213, 215, two signals at a time. Eight clocks T21 to T28 are output from the eight timing difference division circuits 208 to 215.

The rising of the clocks T21 is determined by the delay corresponding to the internal delay as from the rising of the clock Q (n−1) 1.

The rising of the clock T22 is determined by the timing division of the rising of the clock Q (n−1) 1 and the rising of the clock Q (n−1) 2 and by the inner delay.

The rising of the clock T23 is determined by the delay corresponding to the inner delay as from the rising of the clock Q (n−1) 2.

The rising of the clock T24 is determined by the timing division of the rising of the clock Q (n−1) 2 and the rising of the clock Q (n−1) 3 and by the inner delay.

The rising of the clock T25 is determined by the delay corresponding to the inner delay as from the rising of the clock Q (n−1) 3.

The rising of the clock T26 is determined by the timing division of the rising of the clock Q (n−1) 3 and the rising of the clock Q (n−1) 4 and by the inner delay.

The rising of the clock T27 is determined by the delay corresponding to the inner delay as from the rising of the clock Q (n−1) 4.

The rising of the clock T28 is determined by the timing division of the rising of the clock Q (n−1) 4 and the rising of the clock Q (n−1) 1 and by the inner delay.

The clocks T21 and T23 are input to a pulse width correction circuit 216 which then outputs an L pulse P21 having a decaying edge determined by the clock T21 and a rising edge determined by the clock T23. By a similar sequence of operations, pulses p22 to P28 are generated. So, the clocks P21 to P28 are eight pulses with 25% duty respectively dephased by 45°.

The clocks P25, dephased by 180° from the clock P21, are multiplexed and inverted by the multiplexing circuit 224 and output as 25%-duty clock Qn1. In a similar sequence of operations, clocks Qn2 to Qn4 are generated. So, the clocks Qn1 to Qn4 are 50%-duty four-phase H pulses each with a dephasing of 90°.

The period of the clocks Qn1 to Qn4 is just one-half that of the clock Q (n−1) 1 to Q (n−1) 4. That is, the clock frequency is doubled in the course of generating the clocks Qn1 to Qn4 from the clocks Q (n−1) 1 to Q (n−1) 4.

Referring to FIGS. 19 and 20, the circuit configuration of the timing difference division circuits 208 to 215 is explained. The timing difference division circuits 208 to 215 are of the same circuit configuration.

In the following, only the timing difference division circuits 208 and 209 are explained. FIGS. 19 and 20 show the circuit configuration of the timing difference division circuits 208 and 209, respectively. The circuits shown in FIGS. 19 and 20 are similar in structure except that the two inputs vary. That is, the input signals to the two-input NOR circuit differ in FIGS. 19 and 20.

The timing difference division circuit 208 has an inner node N51, as an output node of the two-input NOR 51, having the same input Q (n−1) 1 as an input. The inner node N51 is connected to an input end of the inverter INV51, which outputs T21 at its output end. The timing difference division circuit 208 also includes N-channel MOS transistors MN51, MN52 and MN53, having drains commonly connected to the inner node N51, and which are controlled on and off by a control signal 206 from the period detection circuit 204 being coupled to the gates, and capacitances CAP51, CAP52 and CAP53 connected across the sources of the N-channel MOS transistors MN51, MN52 and MN53 and the ground potential. The gate widths of the N-channel MOS transistors MN51, MN52 and MN53 and the capacitances CAP51, CAP52 and CAP53 are set to the size ratio of e.g., 1:2:4. The clock period is set by eight-stage adjustment of the load connected to the common node based on the control signal 206 output from the period detection circuit 204.

The timing difference division circuit 209 has an inner node N61, as an output node of the two-input NOR 61, having the same input Q (n−1) 2 as an input. The inner node N61 is connected to an input end of the inverter INV61, which outputs T22 at its output end. The timing difference division circuit 208 also includes N-channel MOS transistors MN61, MN62 and MN63, having drains commonly connected to the inner node N61, and which are controlled on and off by a control signal 206 from the period detection circuit 204 being coupled to the gates, and capacitances CAP61, CAP62 and CAP63 connected across the sources of the N-channel MOS transistors MN61, MN62 and MN63 and the ground potential. The gate widths of the N-channel MOS transistors MN61, MN62 and MN63 and the capacitances CAP61, CAP62 and CAP63 are set to the size ratio of e.g., 1:2:4. The clock period is set by eight-stage adjustment of the load connected to the common node based on the control signal 206 output from the period detection circuit 204.

The operation of the timing difference division circuits 208, 209 is now explained by referring to the timing waveform shown in FIG. 21.

The operation of the timing difference division circuit 208 is finished during the time period from tc21 until tc24 of FIG. 21. So, the waveform of the inner node N51 during this time period is shown.

First, the rising timing of the output clock T21 is explained. The two-input NOR 51 includes two P-channel MOS transistors for connecting input signals IN1, IN2 to the gates, and two N-channel MOS transistors, connected in parallel across the output end and the ground and having gates fed with the input signals IN1, IN2.

When the electrical charges of the node N51 are extracted by the NOR51 with the rising edge of the clock Q (n−1) 1, so that the potential of the node N22 reaches the threshold value of the inverter INV51, the edge of the clock T21, output by the inverter INV51, rises. If the electrical charges of the node N51 that need to be extracted until the threshold value of the inverter INV51 is reached, are denoted CV, and the charge extracting current values of the N-channel MOS transistors are denoted I, the result of extracting the electrical charges CV from the rising of the clock Q (n−1) 1, that is CV/2I, represents the timing from the rising of the clock Q (n−1) until rising of the clock T21.

The rising of the clock T21 is by the clock Q (n−1) 1 going low to charge the output node N51 of the two-input NOR51 to high.

As for the operation of the timing difference division circuit 209, shown in FIG. 20, the operation of the timing difference division circuit 209 is well-nigh finished during the time period from ta21 until ta24 of FIG. 21. So, the waveform of the inner node N61 during this time period is shown.

First, the rising timing of the output clock T22 is explained. During the time period tCKn as from the rising edge of the clock D (n−1) 1, the electrical charges of the inner node N22 are extracted by the N-channel MOS transistor. After time tCKn, the residual electrical charges at the inner node N61 are extracted from the rising edge of the clock Q (n−1) 2 by the N-channel MOS transistors, so that, when the potential of the node N61 reaches the threshold value of the inverter INV61, the edge of the clock T22 rises. If the electrical charges of the node N61 are denoted CV, and the charge extracting current values of the N-channel MOS transistors of the two-input NOR61 are denoted I, the result of extracting the current CV from the clock Q (n−1) 1 during the time period I of tCKn with the current I, and during the remaining period with 2I, that is $$tCKn+(CV-tCKn\cdot)/2I=CV+tCKn/2$$

represents the timing as from the rising edge of the clock Q(n−1) until the rising of the clock T22.

Therefore, the timing difference with respect to the rising of the clock T21 is just equal to tCKn/2.

The rising of the clock T22 is by both the clocks Q (n−1) 1 and clocks Q (n−1) 12 going low to charge the output node N61 of the two-input NOR61 high.

The same explanations apply for clocks T23 to T28, that is, the rise timing differences of the clocks T21 to T28 are respectively equal to ½tCKn.

The pulse width correction circuits 216 to 223 are each made up of an inverter INV71 and a two-input NAND 71, as shown in FIG. 22, and generate eight-phase pulses (split signals) P21 to P28, with the duty of 25%, with a dephasing being 45°.

The multiplexing circuit 224 is comprised of a two-input NAND 81, and generates 50% duty four-phase clocks Qn1 to Qn4, having a dephasing of 90°, as mentioned previously. The period of the clocks Qn1 to Qn4 is just one-half the clock Q (n−1) 1 to Q (n−1) 4.

In the present conventional clock multiplying circuits, the condition required to make the load of the common node N61 variable is the same as that in FIG. 9. So, the capacitances and NMOS transistors having the same operating object are used in combination. It is possible not only to increase the operating range for the period of the external clock signals 205 but also to eliminate variations in device characteristics.

In the above-described conventional multiplying circuit, proposed in the JP-A-11-4145, multiplied clocks may be produced by frequency-dividing the external clocks by a factor of four to prepare four-phase clocks at the outset, without using feedback circuits, such as PLL or DLL.

There may also be derived an advantage that, by frequency division by a factor of four, multiplying circuits may be constructed by fully static simple circuits using basic CMOS devices, such as NAND, NOR or inverters.

In the JP-A-11-4145, two-phase multiplied clocks are generated from two-phase clocks, while four-phase multiplied clocks are generated from four-phase clocks. It is however possible to connect plural timing difference division circuits in parallel in a tree-like fashion to increase the number of clock phases exponentially to 2, 4 or 8 to generate higher frequency components.

In the JP-A-11-4145, multiplied clocks may be generated extremely readily by frequency dividing external clocks into multi-phase clocks and taking an intermediate timing of each phase without the necessity of using a loop configuration.

So, the time period in which to produce multiplied clocks may be shorter, while the number of required clocks can be predicted at the outset, and hence the queuing time until using the multiplied clocks may be reduced appreciably.

The method of realising multiples other than powers of two by a similar technique is described in JP Patent Application 09-157042 (JP-A-11-4146), the entire disclosure thereof being herein incorporated by reference thereto.

SUMMARY OF THE DISCLOSURE

However, in the timing difference division circuit (interpolator) in the multiplying circuits, as proposed in JP-A-11-4146 and in JP-A-11-4145, since multi-phase clocks are directly input as input signals, the operating range is not enlarged to the maximum extent.

For example, if the capacitance value of the capacitance device is fixed and four-phase clock signals are input, there is a constraint that the capacitance value which is just one half of the input phase difference is in a range from 1:3 for the smallest and largest values, as now explained.

FIG. 26 shows an illustrative structure of a conventional timing difference division circuit. Referring to FIG. 26, the conventional timing difference division circuit includes a logical sum circuit OR1, fed with first and second input signals IN1, IN2, a P-channel MOS transistor MP1, connected across the power source VCC and the inner node N26 and to the gate of which an output signal of the logical sum circuit OR1 is fed, an inverter INV3, for outputting an inverted version of the potential of the inner node N26, and N-channel MOS transistors MN1, MN2, each having a drain connected to the inner node N26, a gate fed with first and second input signals IN1, IN2, respectively, and a source connected to a constant current source 10. Across the inner node N26 and the ground are connected switching devices MN11 to MN15, comprised of N-channel MOS transistors, and capacitances CAP11 to CAP15. As in the timing difference division circuit, explained with reference to FIGS. 9 to 12, a control signal 106 output from the period detection circuit is connected to control terminals (gate terminals) of the switching devices MN11 to MN15, comprised of N-channel MOS transistors, to set a capacitance value to be appended to the inner node N26.

When the first and second input signals IN1, IN2 are of low levels, an output of the logical sum circuit OR1 goes low to turn on the P-channel MOS transistor MP1 to charge the inner node N26 to the power source potential so that the output of the inverter INV3 goes low.

When one or both of the first and second input signals IN1, IN2 are high, an output of the logical circuit OR1 goes high to turn the P-channel MOS transistor MP1 and the power source path of the inner node N26 and the power source VCC off, while one or both of the N-channel MOS transistors MN1 and MN2 are on, to discharge the inner node N26. When the potential of the inner node N26 starts to be decreased from the power source potential, until a potential that is not higher than the threshold value of the inverter INV3, an output of the inverter INV3 starts from the low level to the high level.

FIG. 27 illustrates the operation of the timing difference division circuit (TMD). Referring to FIG. 27a, two outputs of the first timing difference division circuit (TMD) of the three timing difference division circuits are fed with the same input signal IN1 to output an output signal OUT1. The second timing difference division circuit (TMD) is fed with the input signals IN1, IN2 to output an output signal OUT2, while the third timing difference division circuit (TMD) is fed at two inputs thereof with the same input signal IN2 to output an output signal OUT3. Of these, the second timing difference division circuit (TMD) fed with the input signals IN1, IN2 to output the output signal OUT2 is matched to the structure of the timing difference division circuit 209 of FIG. 17. On the other hand, the timing difference division circuit (TMD) commonly fed with IN1 and the timing difference division circuit (TMD) commonly fed with IN2 are configured for being fed with the same signal in FIG. 26 and hence is matched to the configuration of the timing difference division circuit 208 of FIG. 17.

FIG. 27b shows outputs OUT1 to OUT3 of the first to third timing difference division circuits fed with input signals IN1, IN2 of the timing difference T and changes A1 to A3 of the inner nodes of the first to third timing difference division circuits. For facilitating the description, it is assumed that the inner node is charged from the zero potential and, when the threshold value Vt is exceeded, the output signal is changed from the low level to the high level.

Referring to FIG. 27b, there is a timing difference between the input signals IN1 and IN2, the first timing difference division circuit (TMD) issues an output signal OUT1 with a delay time t1, the third timing difference division circuit (TMD) issues an output signal OUT3 with a delay time t3 and the second timing difference division circuit (TMD) issues an output signal OUT2 with a delay time t2, with the delay time t2 being of a value corresponding to the interior division of the delay time t1 and the delay time t3, such that $$T1=CV/2I$$

$$t2=T+(CV-IT)/(2I)=T/2+CV/2I.$$

On the other hand, t3=T+CV/2I. It is noted that electrical charges discharged until the threshold value of the buffer circuit (inverter), to the input end of which is connected the inner node, is exceeded, is denoted CV.

FIG. 28 is a signal waveform diagram showing, for two-phase clocks IN1, IN2 obtained on frequency division of the clocks with the period equal to tCK, the manner of voltage changes in the inner node 26 and input signals in case the in-phase signals and phase signals are input to the timing difference division circuit shown in FIG. 26.

Referring to FIGS. 26 and 28, if electrical charges discharged until the threshold value of the inverter INV3 is exceeded are CV, where C is a capacitance value appended to the inner node N26, and V is the threshold voltage t of the inverter INV3, the N-channel MOS transistors MN1, MN2 are turned on, in case of the in-phase input, by the rising of the input signal IN1 from the low level to the high level, to turn the N-channel MOS transistors MN1, MN2 on to discharge the electrical charges with the current 2I. The time period during which the N-channel MOS transistors MN1, MN2 are turned on is not longer than 2tCK, so that, if the electrical charges are not extracted during 2tCK, there is produced no output at an output end of the timing difference division circuit.

So, the capacitance value C satisfying $$CV/2I>2tCK$$

represents the maximum value C max meeting the I/2 component of the phase difference T:

$$C\ max=4tCK\cdot I/Vt.$$

In the case of the different phase input, the N-channel MOS transistor MN1 is turned on by the rising of the input signal IN1 from the low level to the high level to discharge the electrical charges at the current I. After T=tCK, the N-channel transistor MN2 is turned on by the rising of the input signal IN2 from the low level to the high level.

If the electrical charges of the node N26, that need to be extracted until the threshold value of the inverter INV3 is reached, are CV, and the current with which the electrical charges of the N-channel MOS transistors MN1 and MN2 is I, respectively, the electrical charges CV are extracted with the current I during the phase difference T as from the rising of the first input signal IN1 until the rising of the second input signal IN2 and thereafter with the current 2I.

If the electrical charges CV are extracted during the phase difference T until the rising of the second input signal IN2, the I/2 component of the phase difference T is removed. So, $$CV/I<T$$

and $$C\ min=tCK\cdot I/Vt.$$

The period of extraction with the current 2I is the overlap period Tovp of the first input signal IN1 and the second input signal IN2. If the CV is not completely extracted during this overlap period Tovp, the output of the timing difference division circuit is devoid of the I/2 component of the phase difference T.

So, the maximum capacitance value C which satisfies $$(CV-T\cdot I)/2I<T$$

represents the maximum value C max:

$$C\ max=(2T+T)I/V=3tCK\cdot I/Vt$$

which satisfies the I/2 component (T/2) of the phase difference T.

If two four-phase clock signals, with a period tCK, are input, to output a signal with a delay just equal to ½ (2tCK), the ratio of the minimum value C min to the maximum value C max of the value of the capacitance appended to the inner node N26 subjected to charging/discharging is approximately 1:3, as shown in FIG. 28, in which the ordinate is the ratio of the interior division of the timing difference division circuit (dividing ratio), which, from the delay time of A1 to A3 in FIG. 27b, is equivalent to A2/(A3−A2), and the abscissa is the value of the capacitance appended to the interior node N26.

In the structure of the conventional timing difference division circuit, shown in, for example, FIG. 26 etc., the MOS transistors and the MOS capacitance are used to adjust the value of the capacitance of the capacitance device CAP appended to the inner node, there is required an area corresponding to the area of the MOS transistors and the MOS capacitances, thus increasing the chip area.

It is therefore an object of the present invention to provide a timing difference division circuit and a method for timing difference division whereby the operating speed may be increased and the chip area may be prevented from being increased while enabling a broadband operation.

According to a first aspect of the present invention, there is provided a timing difference division circuit (e.g., interpolator) at least comprising:

two switches connected in parallel to control a path between an inner node and a power source on or off, one of switches being turned on based on one of two input signals undergoing faster transition to charge or discharge a capacitance appended to the inner node with a first current, the other switch being turned on based on the other input signal undergoing transition with a delay with respect to the one input signal, capacitance appended to the inner node being charged or discharged through the one switch in the on-state and the other switch in the on-state with a current value corresponding to a sum of the first current and a second current;

there being provided a buffer circuit an output logic value of which is changed when the voltage of the inner node exceeds or is smaller than a threshold value. The timing difference division circuit further comprises a circuit unit for setting, based on the one signal and on the other signal, an overlap period (Tovp) during which an on time period of the one switch is overlapped with an on time period of the other switch, to a desired value.

According to a second aspect of the present invention, the aforementioned circuit unit elongates the overlap period (Tovp) forwardly of a leading edge of the other signal undergoing transition with a delay from the one signal. The overlap period (Tovp) may also begin at the leading edge of the other signal and may be further extended from the trailing edge of the one signal so that the overlap period will have an optionally selected value.

According to a third aspect of the present invention, the circuit unit sets the overlap period Tovp so that it begins at the forward edge of the other signal undergoing transition with a delay from the one signal and ends at the trailing edge of the other signal.

According to a fourth aspect of the present invention, the capacitance of the inner node is made up of plural capacitances (typically of MOS capacitors), the connection of which to the inner node is controlled by a control signal.

According to a fifth aspect, there is provided a timing difference division circuit comprising:

a logic circuit generating and outputting a first gate signal and a second gate signal based on a first input signal; and a first switch element connected across a first power source and an inner node and having a control terminal to which is fed the first gate signal;

a first series circuit made up of a second switch element and a first constant current source and a second series circuit made up of a third switch element and a second constant current source, the first and second series circuits being connected in parallel across the inner node and the second power source;

the first and second gate signals being connected to control terminals of the second and third switches, respectively;

the timing difference division circuit further comprising:

a plurality of MOS capacitors, connection of which to the inner node being separately controlled by a control signal; and a buffer circuit an input end of which is connected to the inner node and the value of an output signal of which is determined based on the relative magnitude of a potential of the inner node and a threshold voltage;

wherein an overlap period during which the first and second gate signals output from the logic circuit are both activated to turn on the second and third switch elements is set to an optional value.

According to a sixth aspect, there is provided a timing difference division circuit comprising:

a logic circuit generating and outputting a first gate signal and a second gate signal based on a first input signal and a second input signal;

a first MOS transistor of a first conductivity type, having a source, a drain and a gate connected to a first power source, an inner node and to the first gate signal, respectively;

second and third MOS transistors of a second conductivity type having drains commonly connected to the inner node and to the gates of which the first and second gate signals are connected;

a first constant current source and a second constant current source connected across a source of the second MOS transistor and the second power source and across a source of the third MOS transistor and the second power source, respectively;

a plurality of MOS transistors of the first conductivity type, having sources and drains connected to the inner node and to the gates of which control signals are connected; and a buffer circuit an input end of which is connected to the inner node and the value of an output signal of which is determined based on the relative magnitude of the potential of the inner node and a threshold voltage;

wherein an overlap period during which the first and second gate signals output from the logic circuit are both activated to turn on the second and third MOS transistors simultaneously is set to an optional value.

In the timing difference division circuit of the fifth or sixth aspect, the following may be employed.

The logic circuit outputs, as the first gate signal, a signal the timing of a beginning edge of which is determined by a beginning edge of one of the first and second input signals having a leading phase and the timing of an end edge of which is determined by an end edge of the input signal having a lagging phase;

the logic circuit outputting, as the second gate signal, a signal the timing of a beginning edge of which is determined by a beginning edge of one of the first and second input signals having a lagging phase and the timing of an end edge of which is determined by an end edge of the input signal having the lagging phase.

Also, the following structure may be employed:

The logic circuit includes a first gate circuit outputting a first value as the first gate signal when the first and second signals assume first and second values, respectively, or both assume the second value such that both of the first and second signals assume values other than the first value; and a second gate circuit outputting a first value as the second gate signal when the signal of the lagging phase assumes a second value.

Further, the following structure may be employed:

The logic circuit outputs, as the first and second gate signals, an in-phase signal the timing of a beginning edge of which is determined by a beginning edge of one of the first and second input signals having a leading phase and the timing of an end edge of which is determined by an end edge of the input signal having a lagging phase.

The capacitance values of plural MOS capacitors are connected to the inner node differ from one another.

For the fourth or fifth aspect, the plural MOS transistors of the first conductivity type, the sources and drains of which are connected to the inner node, may be of respectively different gate lengths or gate widths.

For the sixth aspect, the first and second input signals may be made up of clocks of respectively different phases generated on frequency division of input clock signals; and the control signal fed to the gates of the plural MOS transistors of the first conductivity type, the sources and drains of which are both connected to the inner node, is supplied from a circuit detecting the period of the clocks.

According to a seventh aspect, there is provided a clock controlling circuit for generating and outputting multi-phase clocks on frequency division of input clocks;

the clock controlling circuit comprising:

a frequency divider generating and outputting multi-phase clocks by frequency-dividing an input clock;

a period detection circuit for detecting the period of the input clock; and a multi-phase multiplying circuit being fed as input with multi-phase clocks output from the frequency divider to generate multi-phase clocks multiplied from the clocks;

wherein the multi-phase multiplying circuit includes:

a plurality of timing difference division circuits outputting a signal corresponding to division of the timing difference of two inputs as defined in any one of first to sixth aspects, and a plurality of multiplexing circuits multiplexing and outputting outputs of two of the timing difference division circuits.

The clock controlling circuit may further comprise a two-phase clock multiplying circuit, wherein the two-phase clock multiplying circuit includes:

four timing difference division circuits being fed with two-phase clocks and outputting a signal corresponding to division of the timing difference of two inputs, and two multiplexing circuits one being fed with outputs of the first and third timing difference division circuits and the other being fed with outputs of the second and fourth timing difference division circuits.

For the clock controlling circuit, the multi-phase clock multiplying circuit may include (a) 2n timing difference division circuits each being fed with n-phase clocks (first to nth clocks) and outputting a signal corresponding to the division of the timing difference of two inputs;

the 2I−1st timing difference division circuit, where $1 \leq I \leq n$, being fed with the same Ith clock as the two inputs;

the 2Ith timing difference division circuit, where $1 \leq I \leq n$, being fed with the Ith clock and (I+1 mod n)th clock, as inputs, where "mod" denotes remainder processing and I+1 mod n means a remainder resulting from division of I+1 by n;

(b) 2n pulse width correction circuits fed with an output of the Jth timing difference division circuit, where $1 \leq J \leq 2n$, and with an output of the (J+2mod n) th timing difference division circuit, where n is a remainder obtained on dividing J+2 with n, as inputs; and (c) n multiplexing circuits fed each with an output of the Kth pulse width correction circuit, where $1 \leq K \leq n$, and with an output of the (K+n)th pulse width correction circuit, as inputs.

According to an eighth aspect, there is provided a signal controlling method in which one of two switches connected in parallel across an inner node and a power source is turned on based on one of two input signals undergoing faster transition to charge or discharge a capacitance of the inner node with a first current, the other switch being turned on based on the other input signal undergoing transition with a delay with respect to the one input signal, the capacitance of the inner node being charged or discharged through the one switch in the on-state and the other switch in the on-state with a current value corresponding to a sum of the first current and a second current, an output logic value of the buffer circuit being changed when the voltage of the inner node exceeds or is smaller than a threshold value of the buffer circuit to output from the buffer circuit a signal of a delay time corresponding to a divided value of the timing difference of two input signals;

wherein based on the one signal and the other signal, an overlap period (Tovp) during which an on time period of the one switch is overlapped with an on time period of the other switch is made adjustable to a desired value to enlarge the range of the capacitance appended to the inner node with respect to the divided value of the timing difference of the two input timing signals.

In the signal controlling method, the overlap period (Tovp) may be elongated forwardly of a leading edge of the other signal undergoing transition with a delay with respect to the one signal or the overlap period (Tovp) is caused to begin at the leading edge of the other signal and to be elongated rearwardly of the trailing edge of the one signal so that the overlap period will have an optional value.

In the signal controlling method, the overlap period (Tovp) may be caused to begin at the forward edge of the other signal undergoing transition with a delay from the one signal and to end at the trailing edge of the other signal.

According to a ninth aspect, there is provided a signal controlling method in which first and second input signals with respective different phases are input and an output signal of a delay time determined by a time resulting from division of a timing difference between the two input signals, wherein from the first and second input signals, a first gate signal and a second gate signal are generated, the timing of a beginning edge of the first gate signal being determined based on a beginning edge of one of the first and second input signals having a leading phase, and the timing of an end edge of the first gate signal being determined by an end edge of the input signal having a lagging phase, and the timing of a beginning edge of the second gate signal being determined by a beginning edge of one of the first and second input signals having a lagging phase, and the timing of an end edge of the second gate signal being determined by an end edge of the input signal having the lagging phase, the capacitance of the inner node is first charged or discharged by one of first and second switch elements connected across the inner node and a power source, the one being turned on based on the first gate signal;

subsequently the capacitance of the inner node is also charged or discharged by the switch element turned on based on the second gate signal in conjunction with the switch element turned on based on the second gate signal; and wherein from a buffer circuit to an input end of which the inner node is connected and an output logic value of which is changed in case where the inner node voltage exceeds or is smaller than a threshold value, an output signal including a time resulting from division of the timing difference of the first and second input signals is output.

BRIEF DESCRIPTION OF THE DRAWINGS

FIG. 27(a) to FIG. 27(c) illustrate the operating principle of a timing difference division circuit (interpolator).

PREFERRED EMBODIMENTS OF THE INVENTION

Figure 1A:
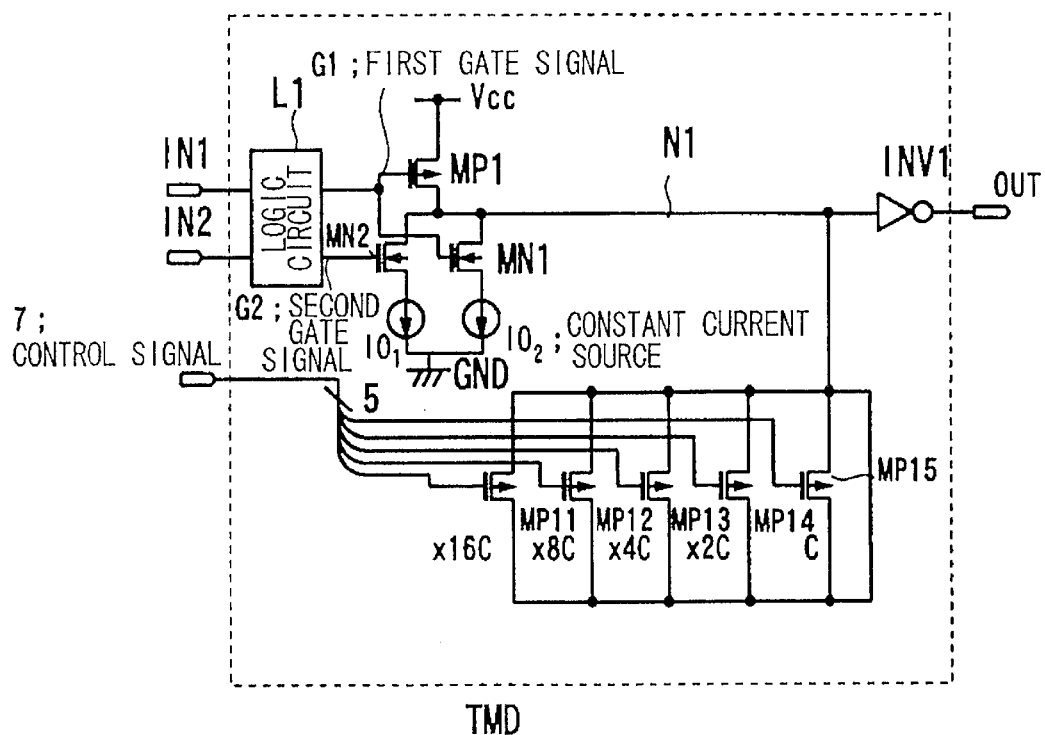
FIG. 1a shows a structure of an embodiment of the present invention and FIG. 1b is a timing diagram showing the operation.

An embodiment of the present invention is explained. The present invention is directed to a timing difference division circuit at least including two switches MN1, MN2 connected in parallel to control a path between an inner node N1 and a power source on or off, one of the switches MN1 being turned on based on one of two input signals IN1, IN2 undergoing faster transition to charge or discharge a capacitance C appended (connected) to the inner node N1 with a first current (I), the other switch MN2 being turned on based on the other input signal undergoing transition with a delay with respect to the one input signal, the capacitance appended to the inner node being charged or discharged through the one switch in the on-state and the other switch in the on-state with a current value corresponding to a sum (2I) of the first current and a second current; there being provided a buffer circuit INV1 an output logic value of which is changed when the voltage of the inner node exceeds or is smaller than a threshold value. The timing difference division circuit includes a circuit unit L1 for setting, based on the one signal and on the other signal, an overlap period Tovp during which an on time period of the one switch is overlapped with an on time period of the other switch, to a desired value.

More specifically, a preferred embodiment is directed to a timing difference division circuit L1 including a logic circuit L1 fed with a first input signal and a second input signal IN1, IN2 and outputting first and second gate signals G1, G2, a first MOS transistor MP1 of a first conductivity type, having a source, a drain and a gate connected to a first power source Vcc, an inner node N1 and to the first gate signal G1, respectively, second and third MOS transistors MN1, MN2 of a second conductivity type having drains commonly connected to the inner node and to the gates of which the first and second gate signals G1, G2 are connected, a first constant current source and a second constant current source $10_1$, $10_2$ connected across a source of the second MOS transistor MN1 and the second power source and across a source of the third MOS transistor MN2 and the second power source GND, respectively, a plurality of MOS capacitors MP11 to MP14 of the first conductivity type connected to the inner node and a buffer circuit INV1 an input end of which is connected to the inner node N1 and the value of an output signal of which is determined based on the relative magnitude of the potential of the inner node and a threshold voltage Vt.

In a preferred embodiment of the present invention, the logic circuit L1 outputs, as the first gate signal G1, a signal the timing of a beginning edge of which is determined by a beginning edge (leading edge) of one of the first and second input signals IN1, IN2 having a leading phase and the timing of an end edge of which is determined by an end edge (trailing edge) of the input signal having a lagging phase. The logic circuit L1 outputs, as the second gate signal, a signal the timing of a beginning edge of which is determined by a beginning edge of one of the first and second input signals having a lagging phase and the timing of an end edge of which is determined by an end edge of the input signal having the lagging phase.

In a preferred embodiment of the present invention, the timing of the first and second gate signals, output from the logic circuit L1, is adjusted by adjusting the timing at which the second and third MOS transistors MN1, MN2 of the second conductivity type are overlapped and turned on. The maximum value C max of the capacitance to be appended to the inner node N1 can be varied when two four-phase clocks with the period tCK are input and signals with the delay just equal to ½ (2tCK) can be varied.

In the conventional timing difference division circuit, it is retained to be necessary to extract electrical charges CV of the inner node down to the threshold voltage or less, within the phase difference T and the overlapping time Tovp (=tCK) of the first and second input signals IN1, IN2 of a signal with a dephasing of 90°, obtained on frequency-dividing clocks by a factor of four (period: 4tCK), with a ratio of the minimum value C min to the maximum value C max being 1:3.

By frequency dividing the external clocks into multi-phase clocks and taking the intermediate timing of the respective phases, it is possible to enlarge the operating range that permits the desired timing difference dividing operation in a timing difference division circuit used in a circuit that can generate multiplied clocks extremely readily without employing a looped structure.

The present embodiment of the present invention also features using MOS capacitors MP11 to MP14 as capacitances appended (annexedly connected) to the inner node N1.

The MOS capacitors MP11 to MP14 are MOS transistors the sources and the drains of which are connected to the inner node N1, and the gates of which are fed with a control signal 7. If, in the case of a p-type semiconductor, the voltage VG applied to the gate, that is the voltage of the control signal 7, is positive, a depletion layer is produced in the semiconductor interface, so that, as an equivalent circuit, there is produced a capacitor comprised of a series connection of the capacitance CD of the depletion layer and the capacitance C0 of the gate oxide film. Plural MOS transistors (MP11 to MP14) of the first conductivity type are of respective different gate lengths or gate widths.

With such structure of the present invention, the chip area arranged in an integrated circuit can be smaller than that of a conventional circuit explained with reference to e.g., FIG. 26.

The timing difference division circuit according to the present embodiment includes a frequency divider 2 (FIG. 4) for generating and outputting multi-phase clocks on frequency division of input clocks, a period detection circuit 6 (FIG. 4) for detecting the period of the input clock, and a multi-phase multiplying circuit 5 for being fed as input with multi-phase clocks output from the frequency divider to generate multi-phase clocks multiplied from the clocks. The multi-phase multiplying circuit includes a plurality of timing difference division circuits for outputting a signal corresponding to division of the timing difference of two inputs and a plurality of multiplexing circuits for multiplexing and outputting outputs of two of the timing difference division circuits.

The control signal from the period defection circuit is fed as a control signal to the MOS capacitance device connected to an inner node of the timing difference division circuit.

Figure 7:
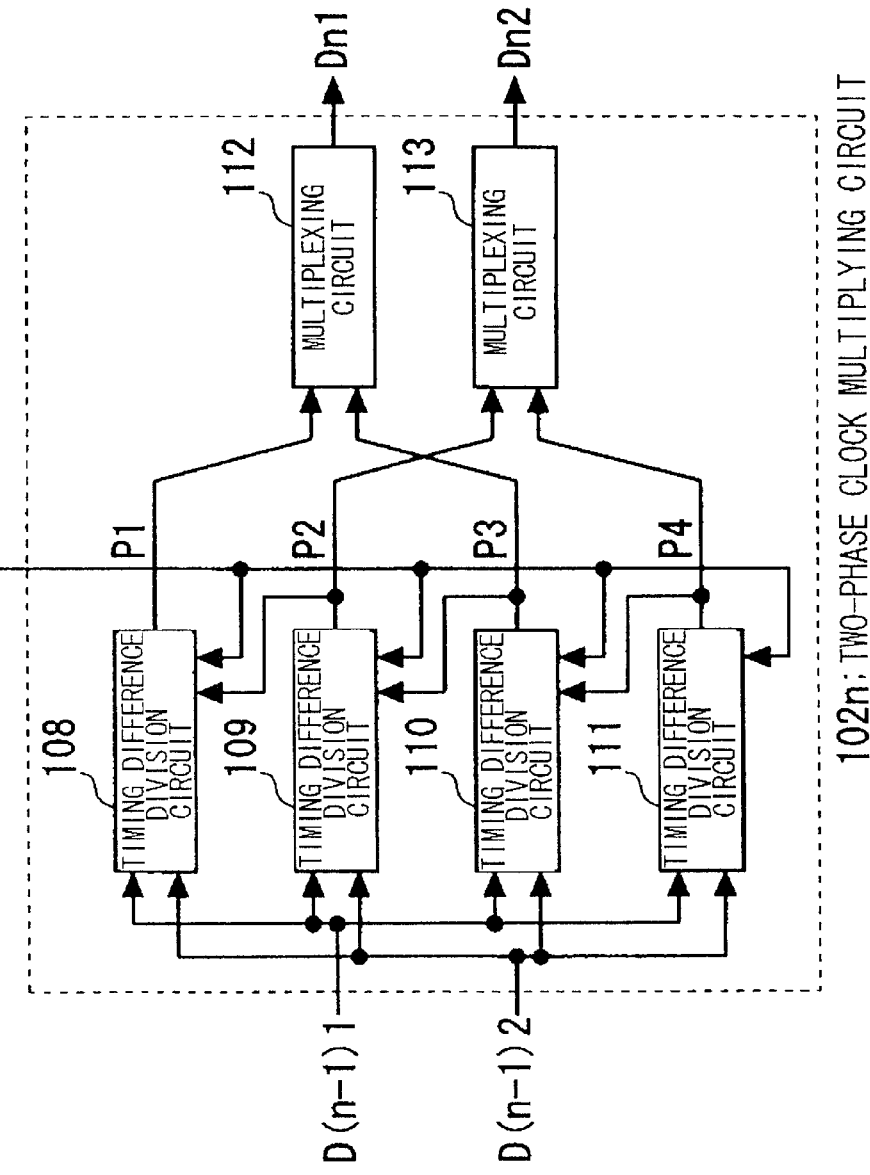
FIG. 7 is a circuit diagram showing a two-phase clock multiplexing circuit used in the clock signal-controlling device shown in JP-A-11-4145.
Figure 8:
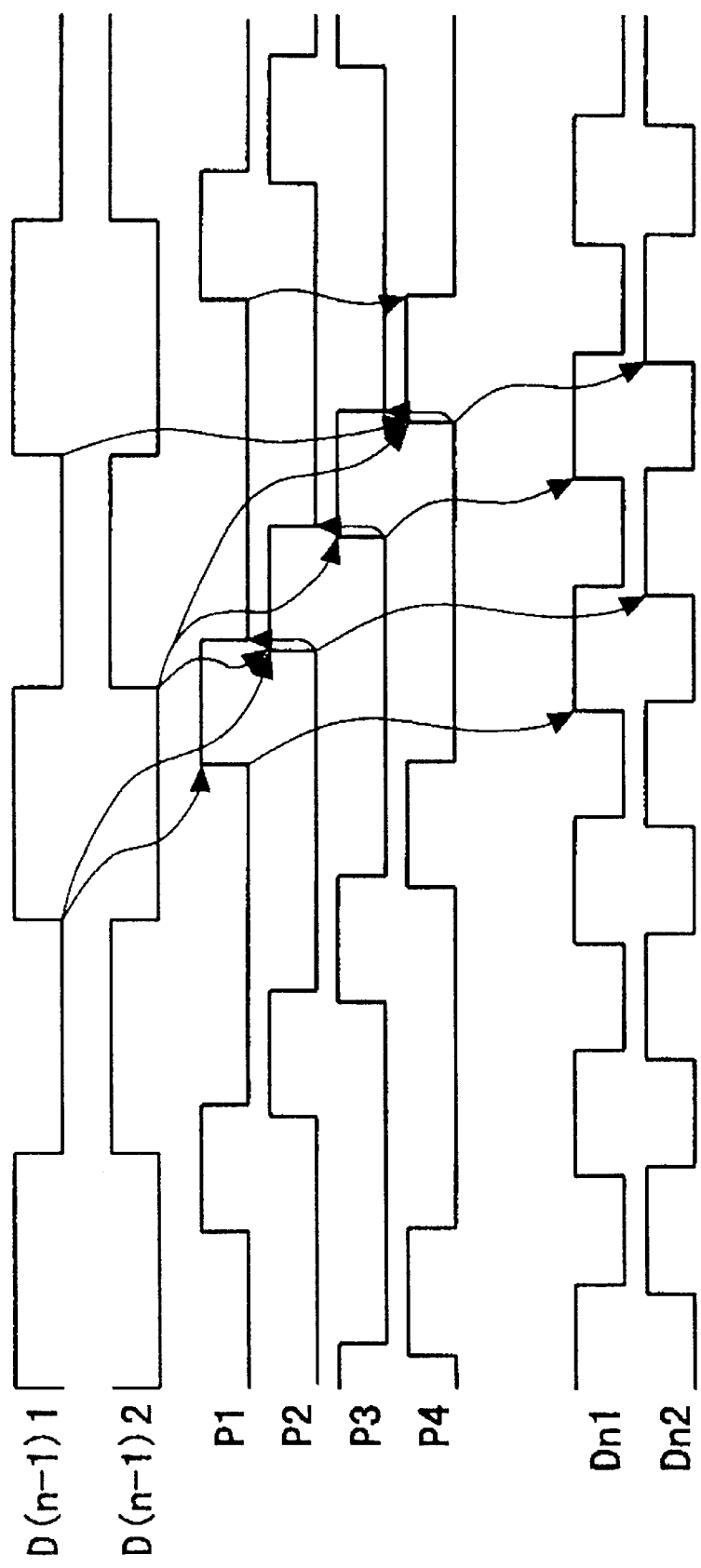
FIG. 8 is a timing chart for illustrating the operation used in the clock signal controlling device shown in JP-A-11-4145.
Figure 9:
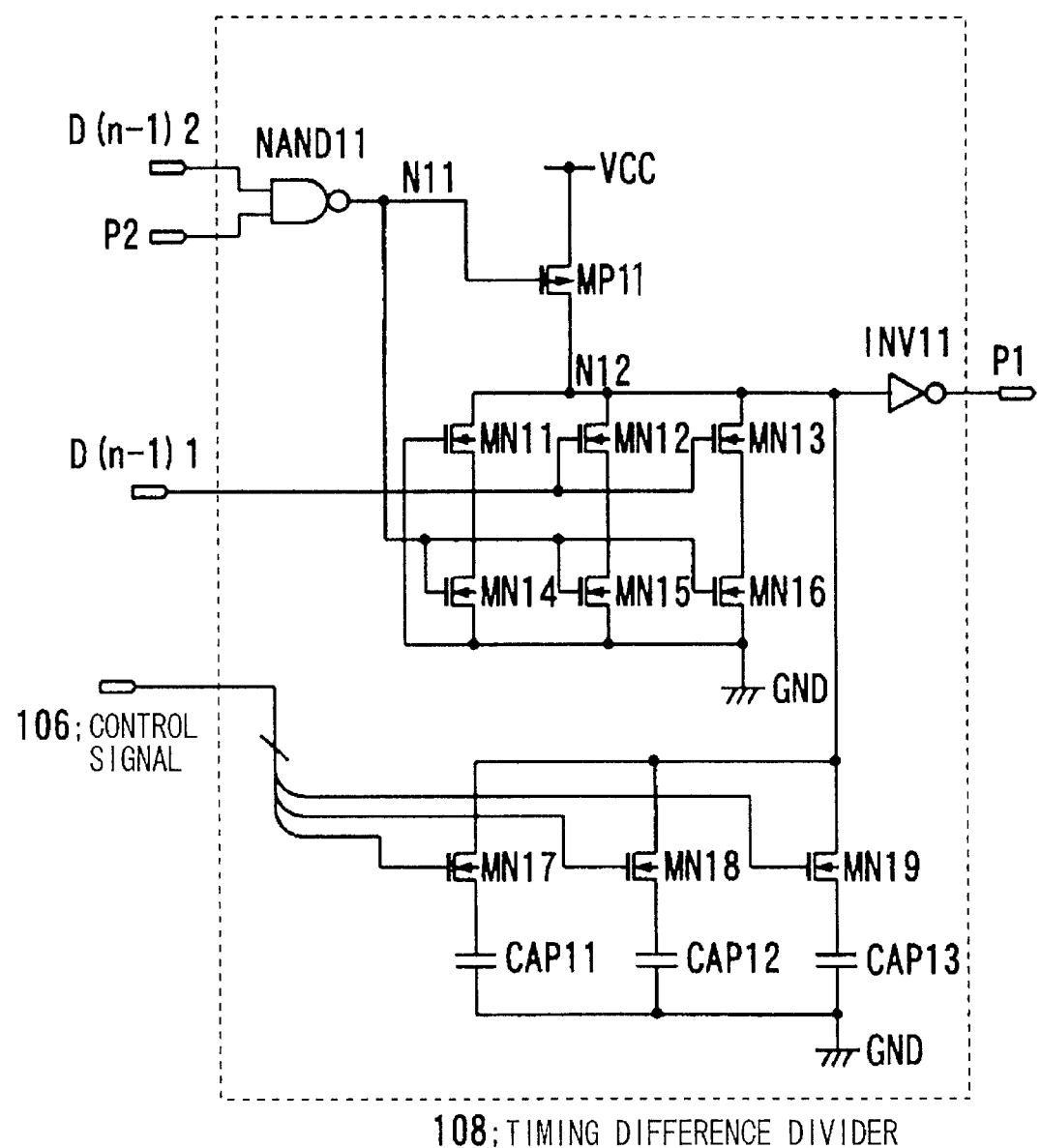
FIG. 9 is a circuit diagram showing timing difference division circuit used in the clock signal-controlling device shown in JP-A-11-4145.
Figure 10:
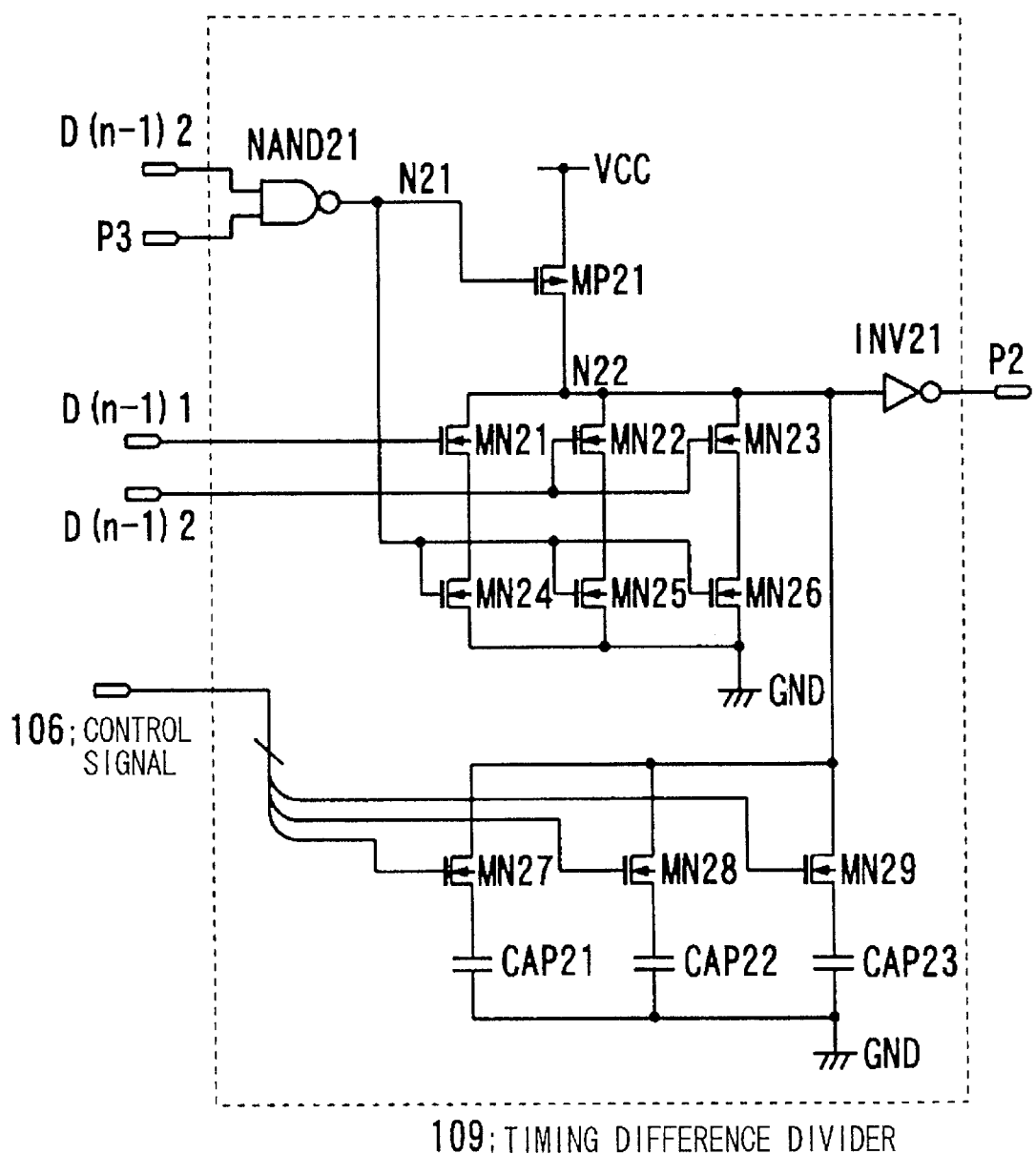
FIG. 10 is a circuit diagram showing timing difference division circuit used in the clock signal-controlling device shown in JP-A-11-4145.
Figure 11:
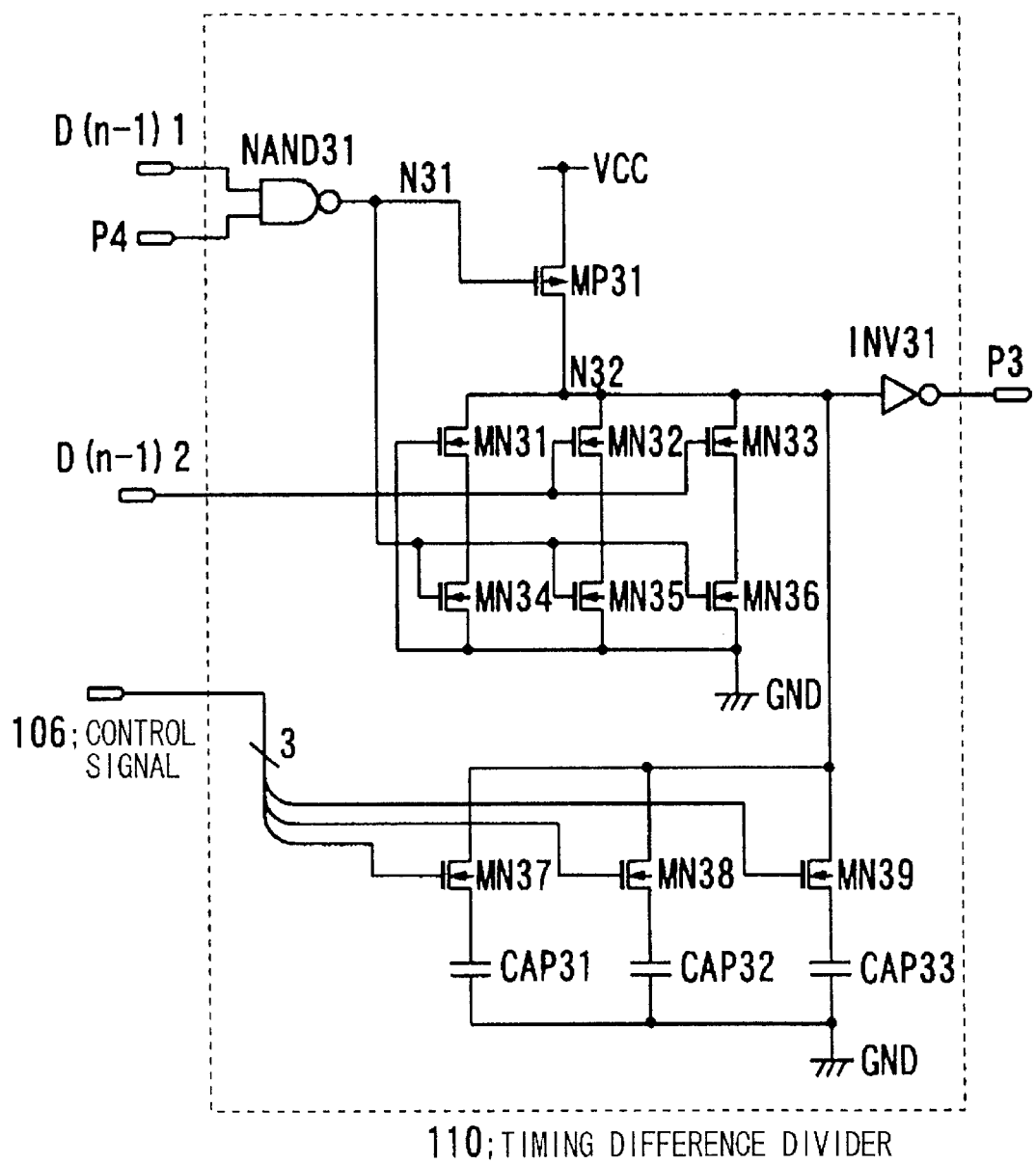
FIG. 11 is a circuit diagram showing a specified typical timing difference division circuit used in the clock signal-controlling device shown in JP-A-11-4145.
Figure 12:
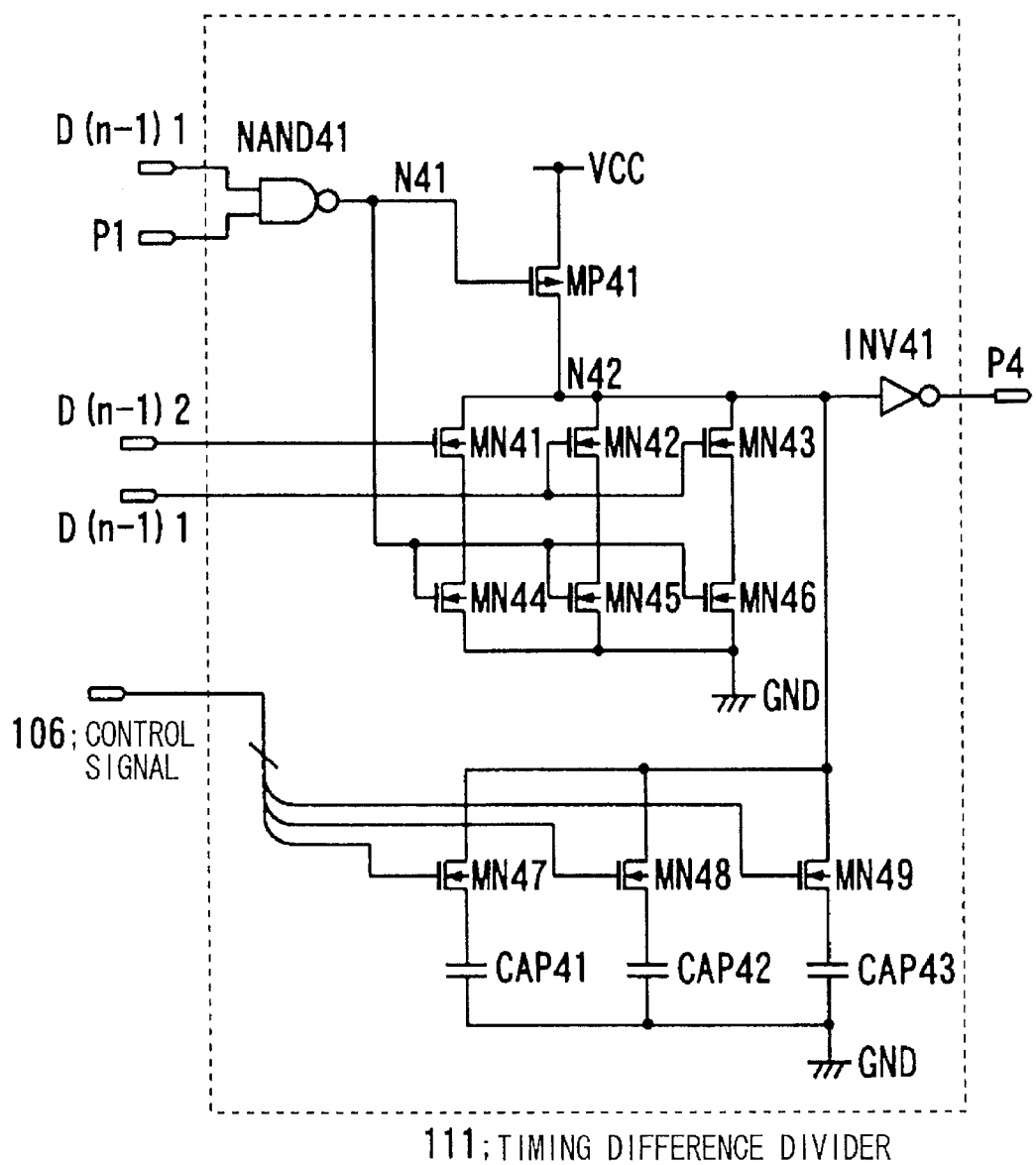
FIG. 12 is a circuit diagram showing another specified typical timing difference division circuit used in the clock signal-controlling device shown in JP-A-11-4145.
Figure 13:
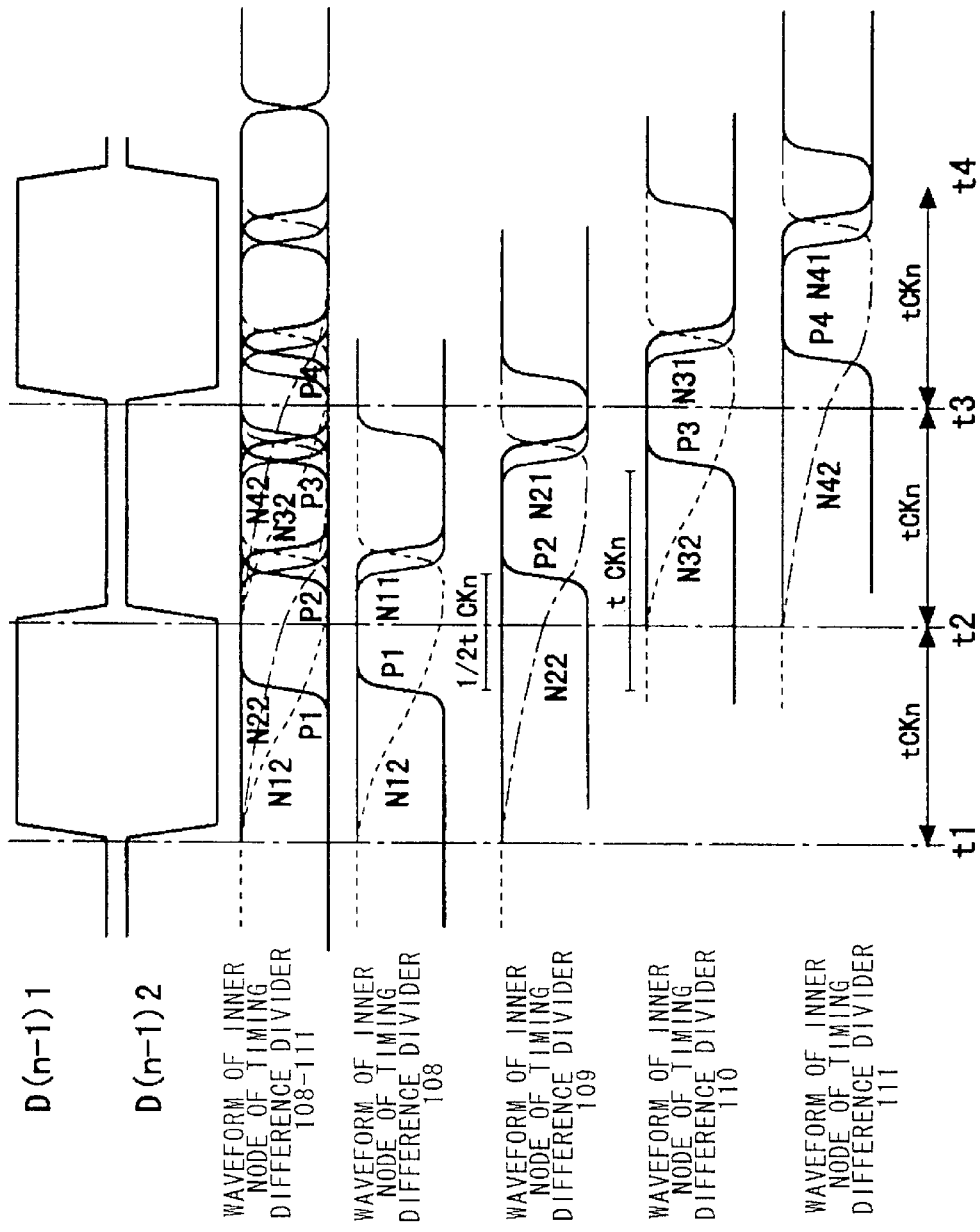
FIG. 13 is a timing chart for illustrating the operation of four timing difference division circuits used in the clock signal controlling device shown in JP-A-11-4145.
Figure 14:
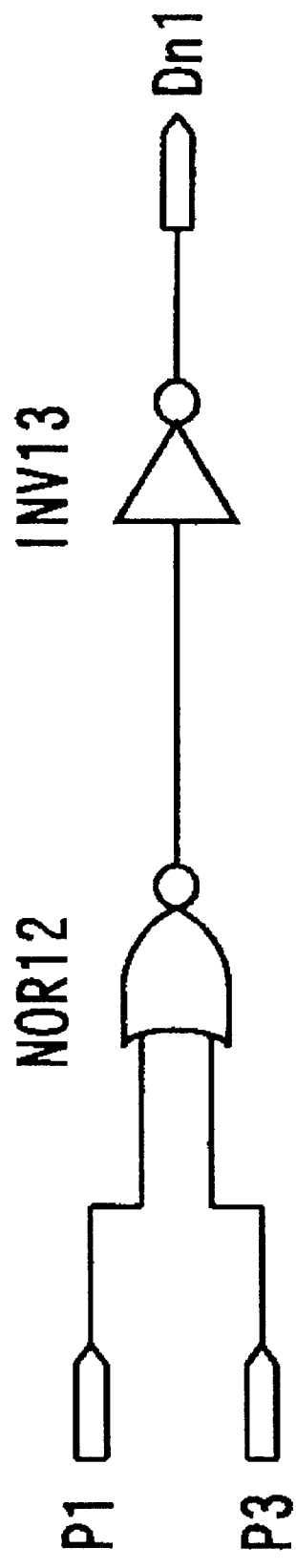
FIG. 14 is a circuit diagram showing a specified typical multiplexing circuit used in the clock signal-controlling device shown in JP-A-11-4145.
Figure 15:
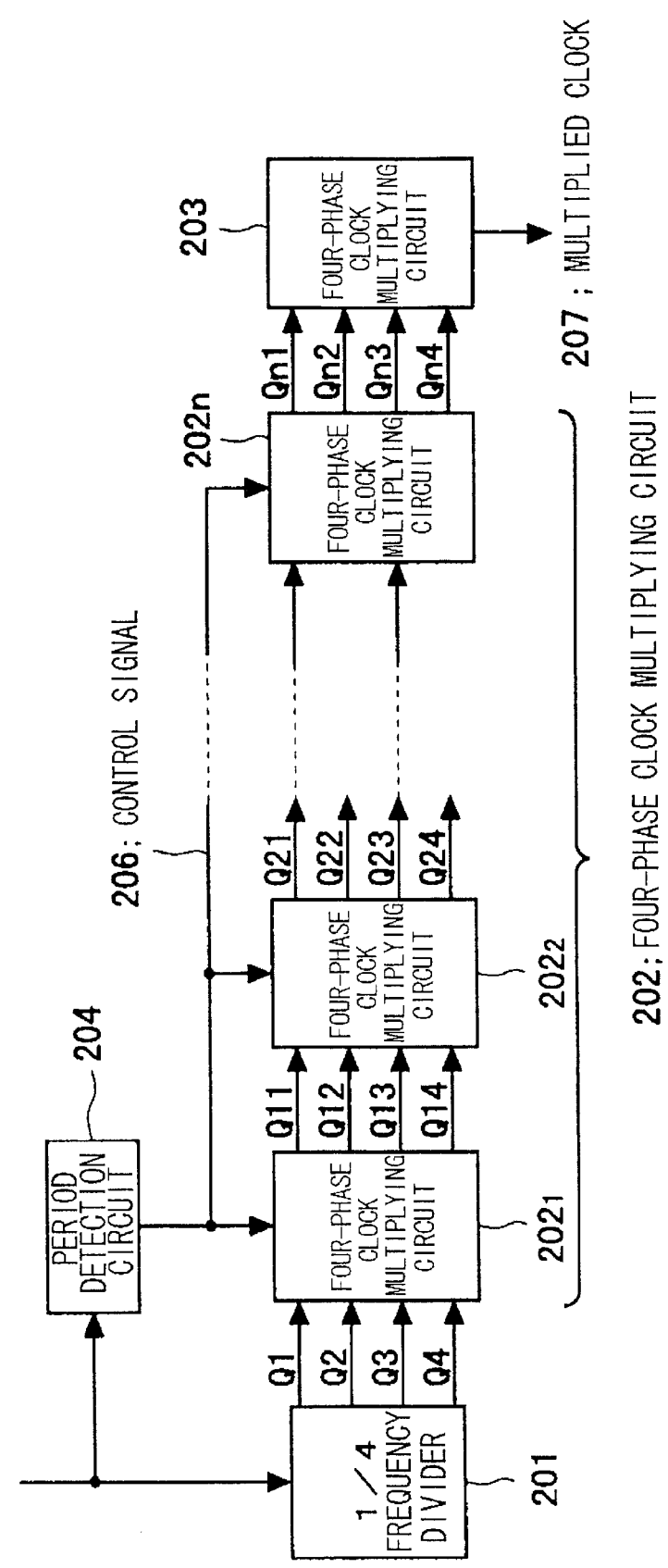
FIG. 15 shows the structure of a clock signal controlling device shown in JP-A-11-4145 (embodiment 2).
Figure 16:
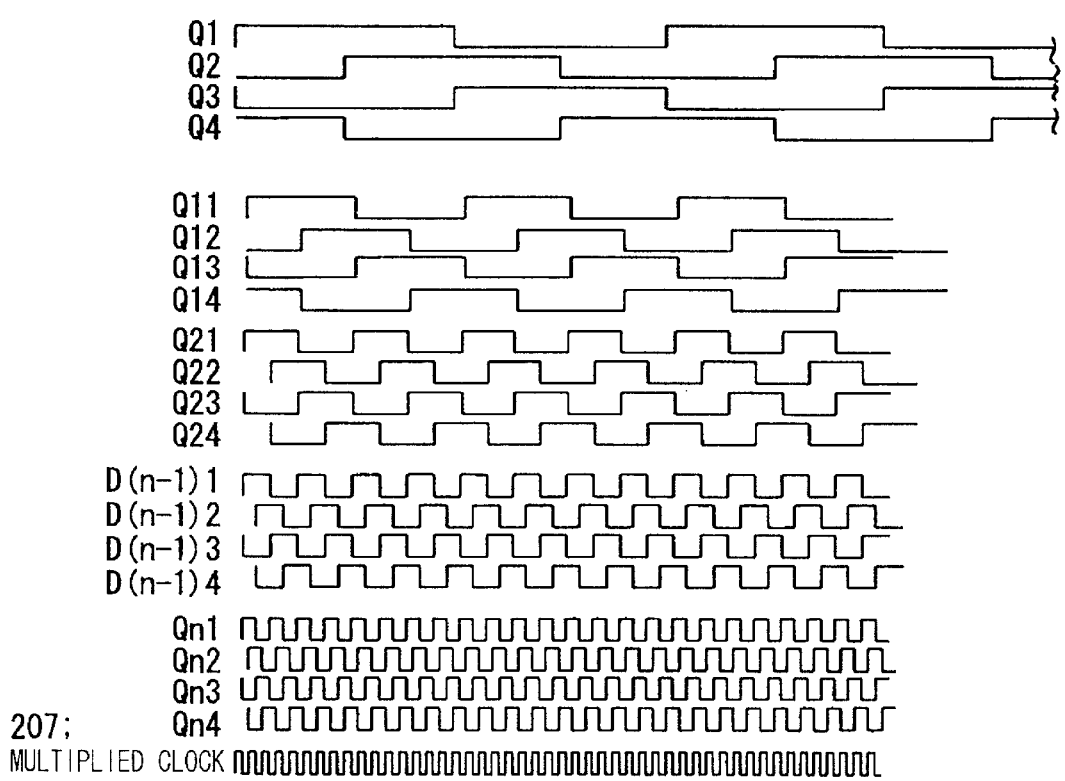
FIG. 16 is a timing chart for illustrating the operation of the clock signal controlling device shown in JP-A-11-4145 (embodiment 2).

The clock controlling circuit also includes a two-phase clock multiplying circuit, these two-phase clock multiplying circuit including four timing difference division circuits 108 to 111 of FIG. 7 for being fed with two-phase clocks (first and second clocks) and for outputting a signal corresponding to division of the timing difference of two inputs, and two multiplexing circuits for being each fed with outputs of the first and third timing difference division circuits and outputs of the second and fourth timing difference division circuits. The timing difference division circuit of the present invention is used as these timing difference division circuits.

Figure 17:
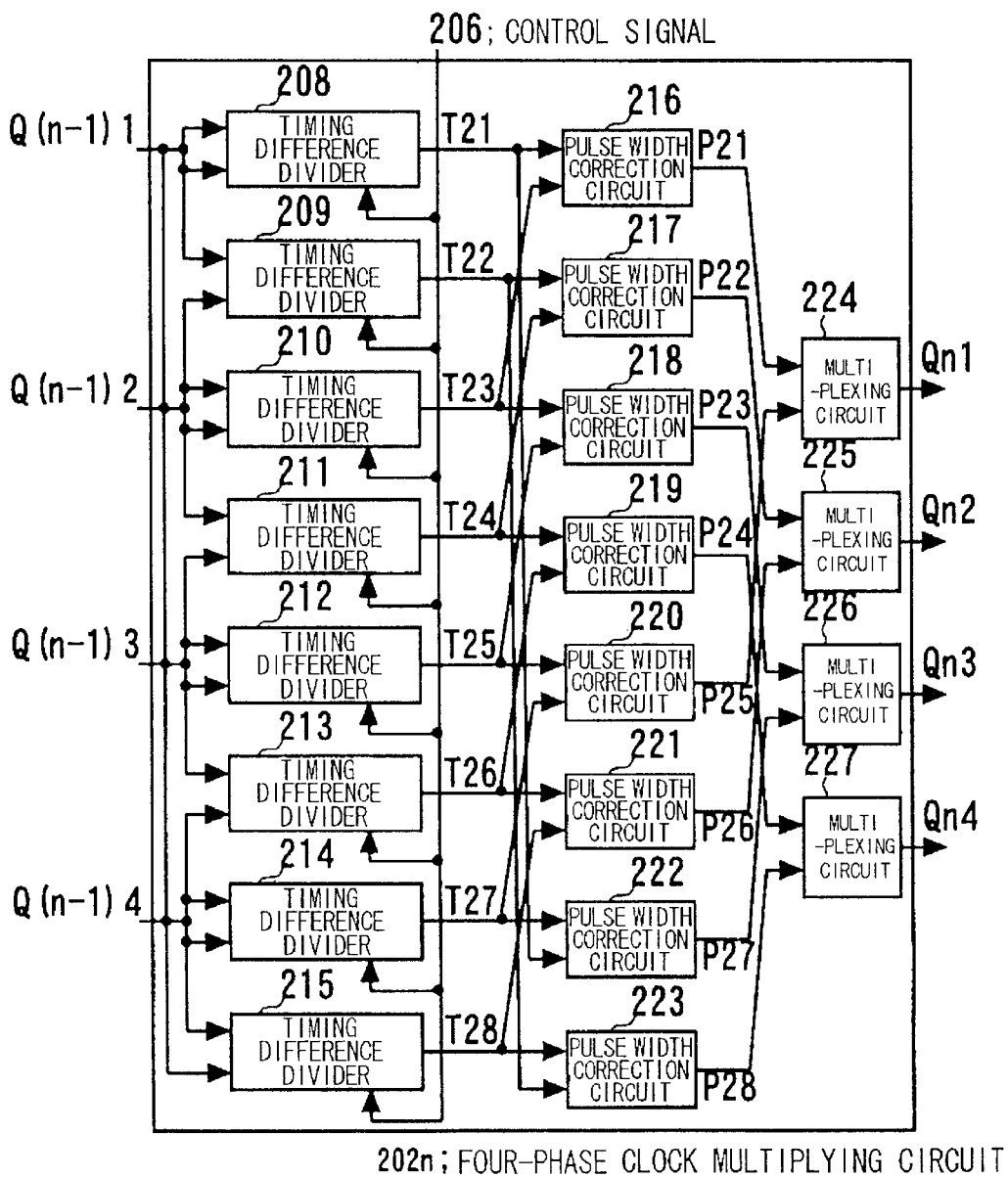
FIG. 17 is a circuit diagram showing a specified typical four-phase clock multiplying circuit used in the clock signal controlling device shown in JP-A-11-4145 (embodiment 2).
Figure 18:
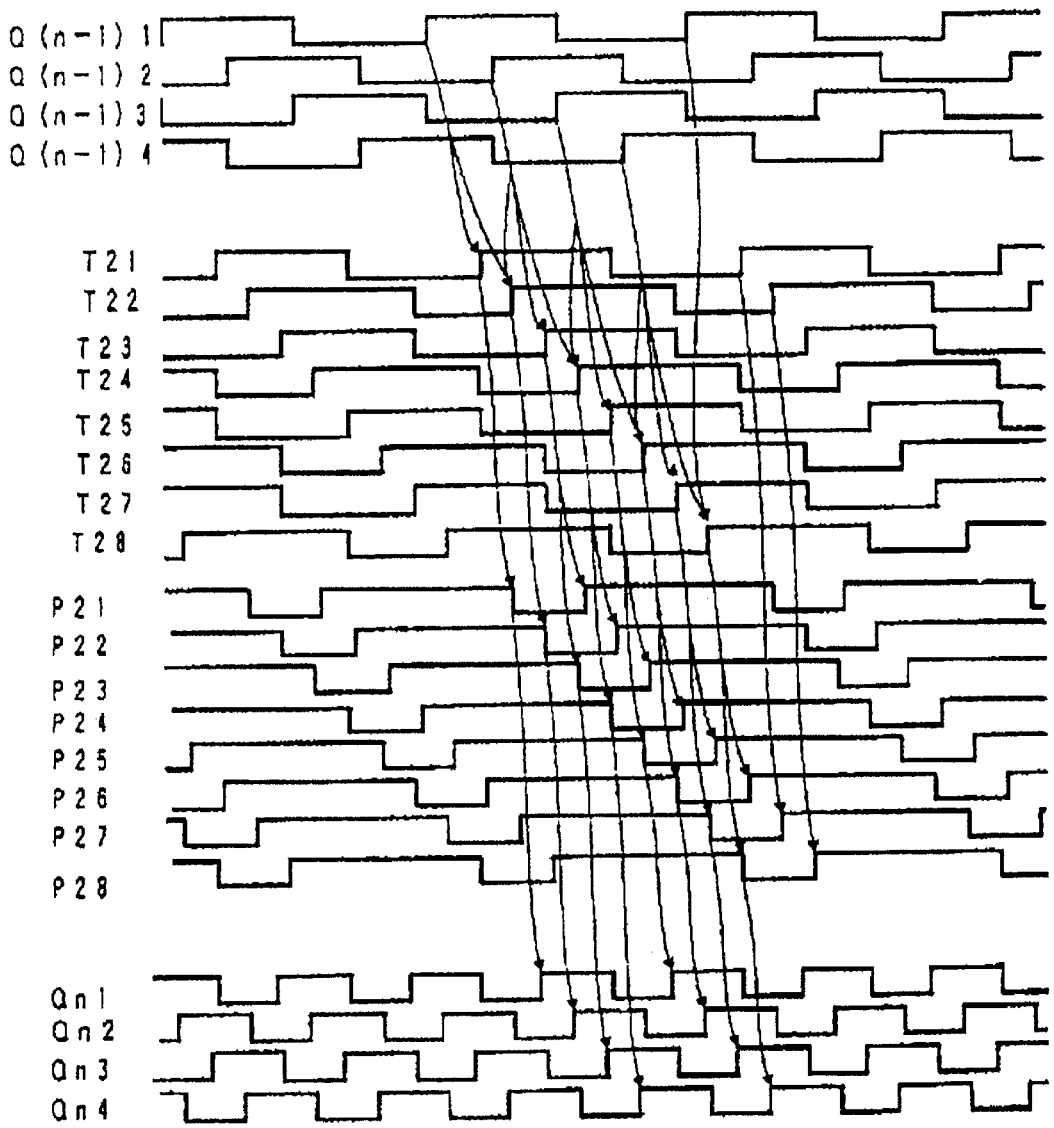
FIG. 18 is a timing chart for illustrating the operation of a four-phase clock multiplying circuit used in the clock signal controlling device shown in JP-A-11-4145 (embodiment 2).
Figure 19:
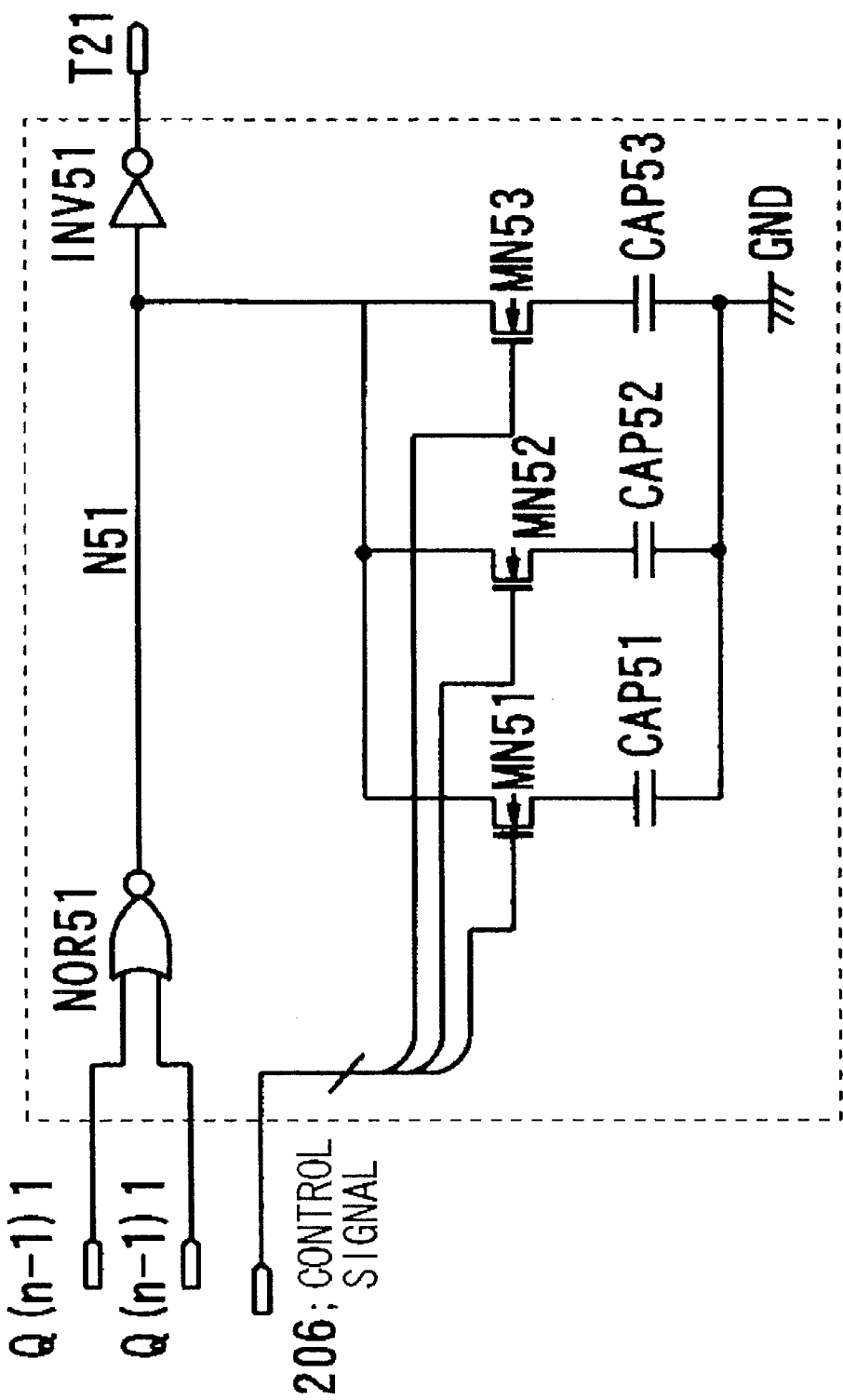
FIG. 19 is a circuit diagram showing a specified typical timing difference division circuit used in the clock signal controlling device shown in JP-A-11-4145 (embodiment 2).
Figure 20:
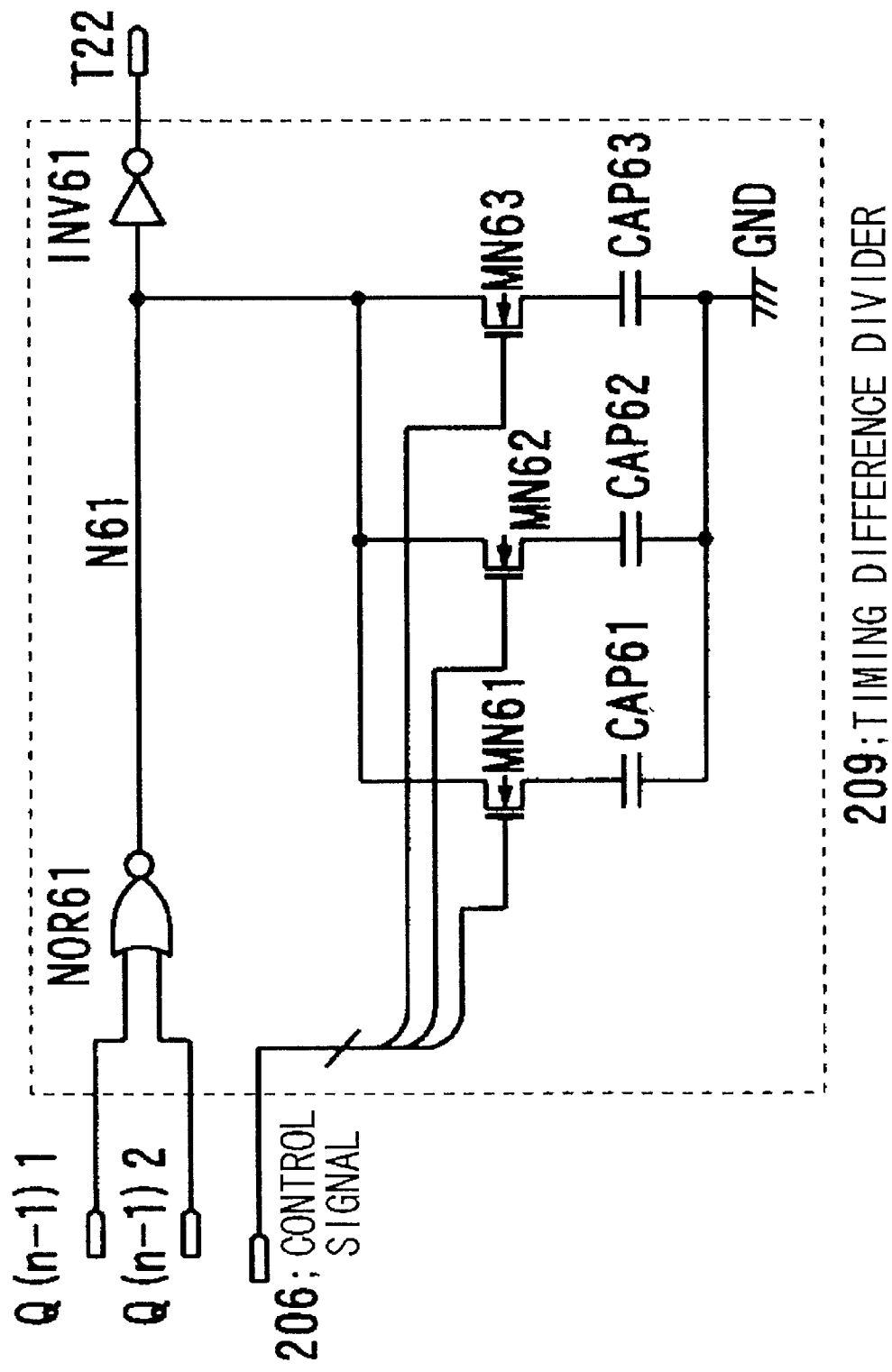
FIG. 20 is a circuit diagram showing a specified typical timing difference division circuit used in the clock signal controlling device shown in JP-A-11-4145 (embodiment 2).
Figure 21:
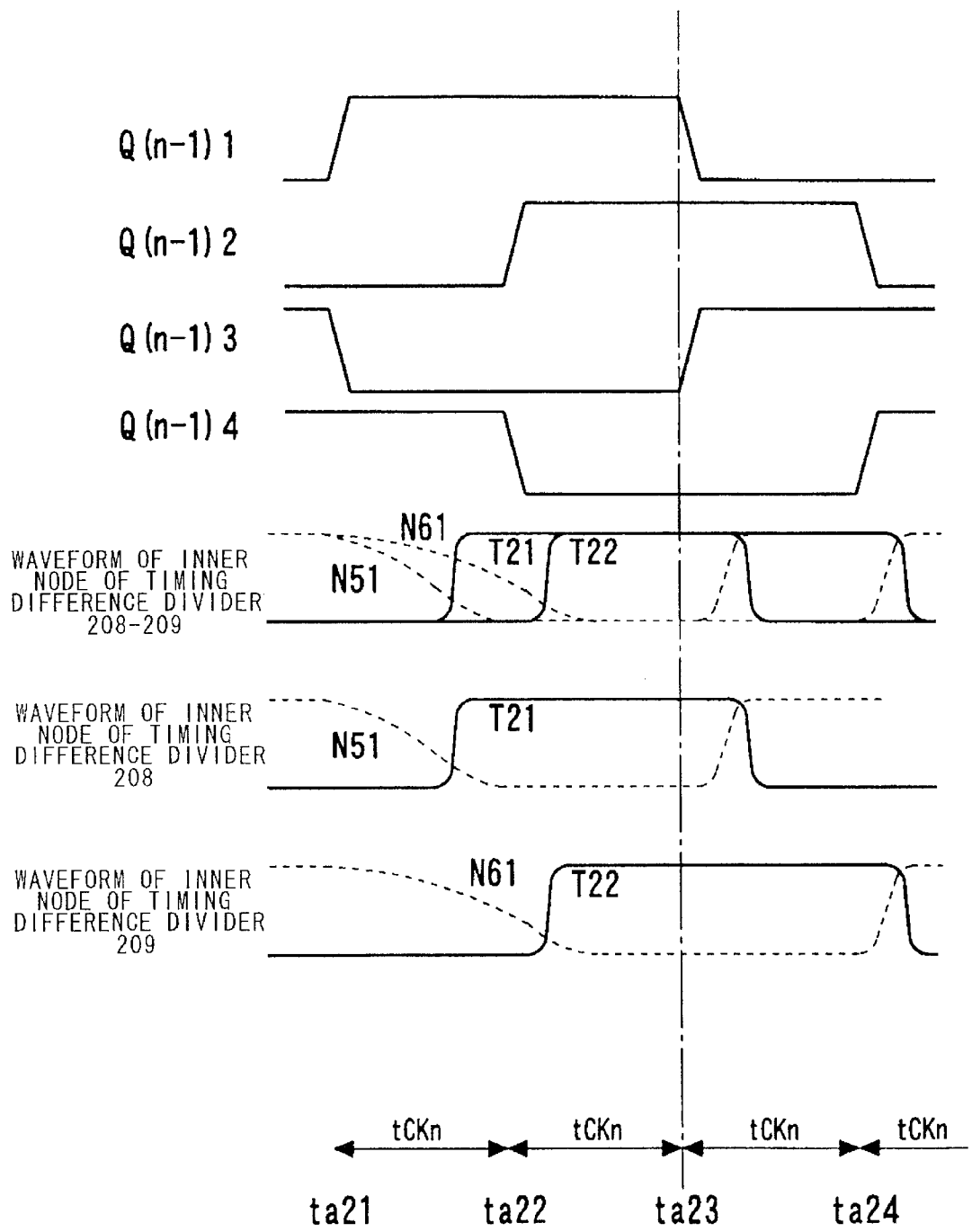
FIG. 21 is a timing chart for illustrating the operation of the timing difference division circuit used in the clock signal controlling device shown in JP-A-11-4145 (embodiment 2).
Figure 22:
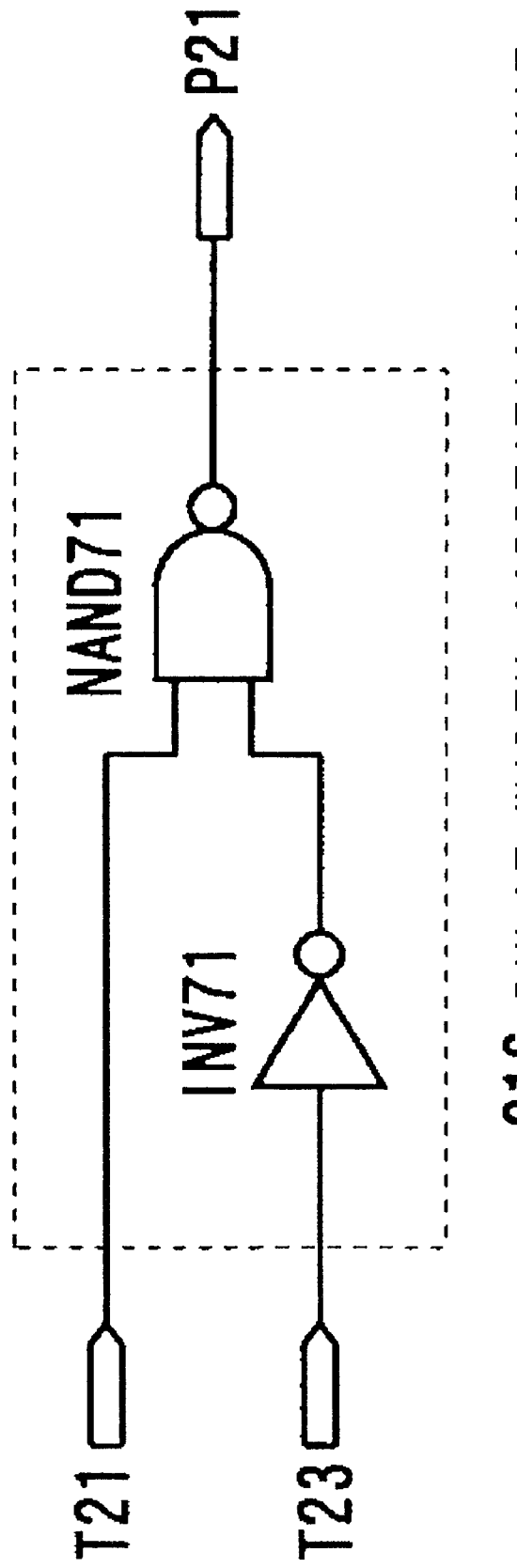
FIG. 22 is a circuit diagram showing a specified typical pulse width correction circuit used in the clock signal controlling device shown in JP-A-11-4145 (embodiment 2).
Figure 23:
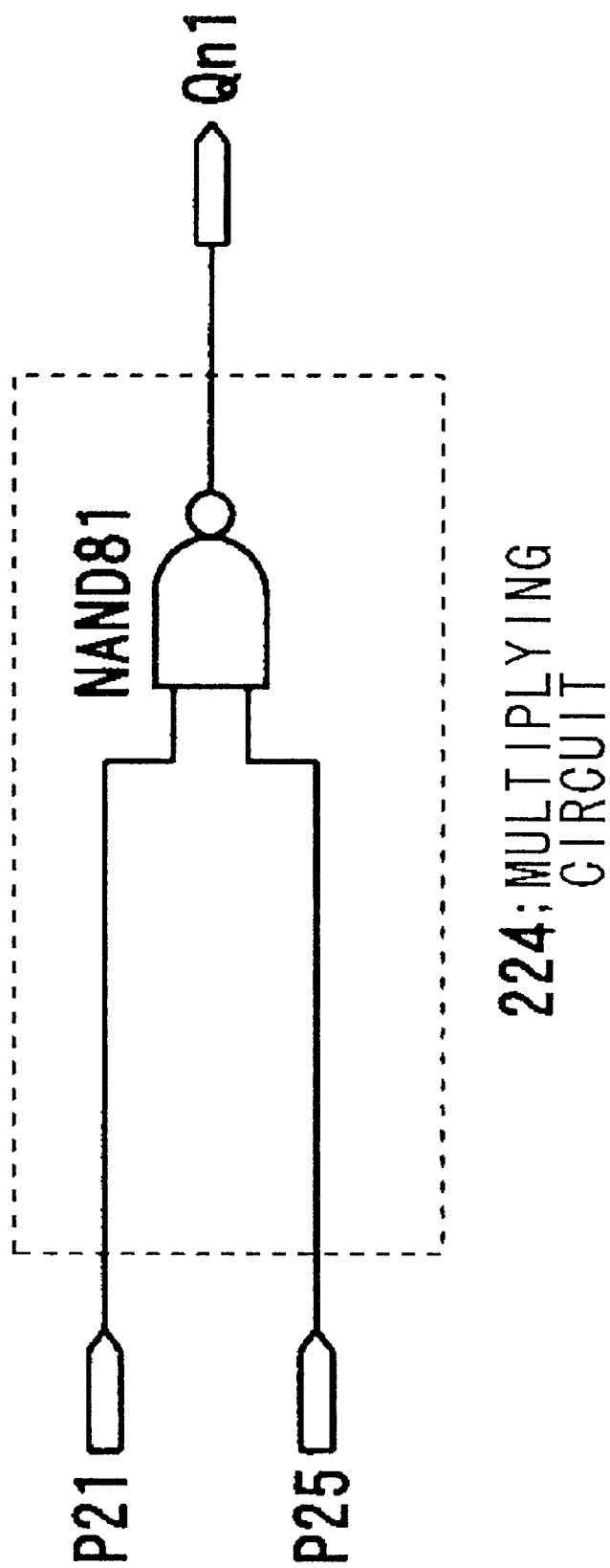
FIG. 23 is a circuit diagram showing a specified typical multiplexing circuit used in the clock signal controlling device shown in JP-A-11-4145 (embodiment 2).
Figure 24:
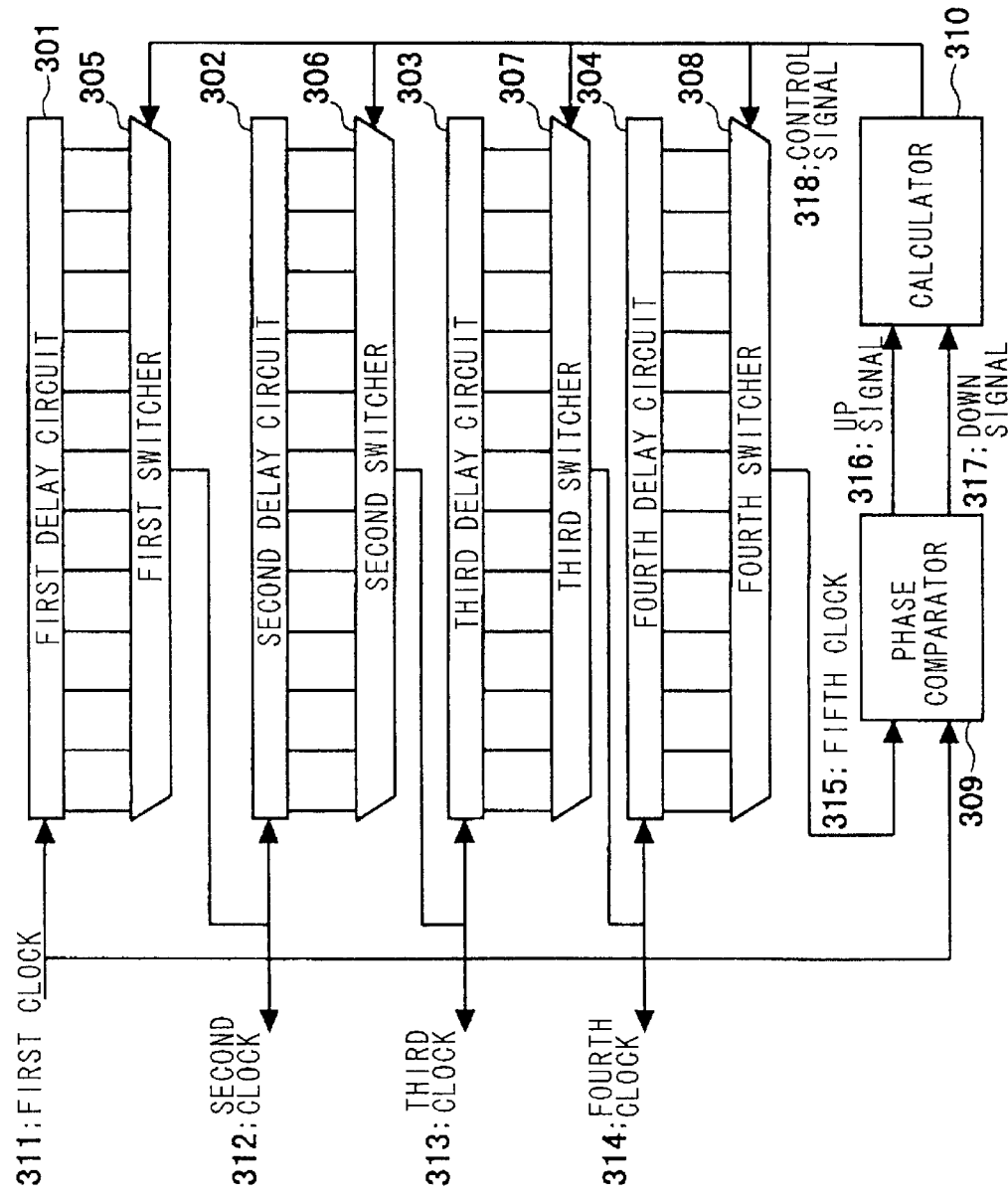
FIG. 24 is a circuit diagram showing a conventional clock signal multiplying circuit employing a delay circuit queue.
Figure 25:
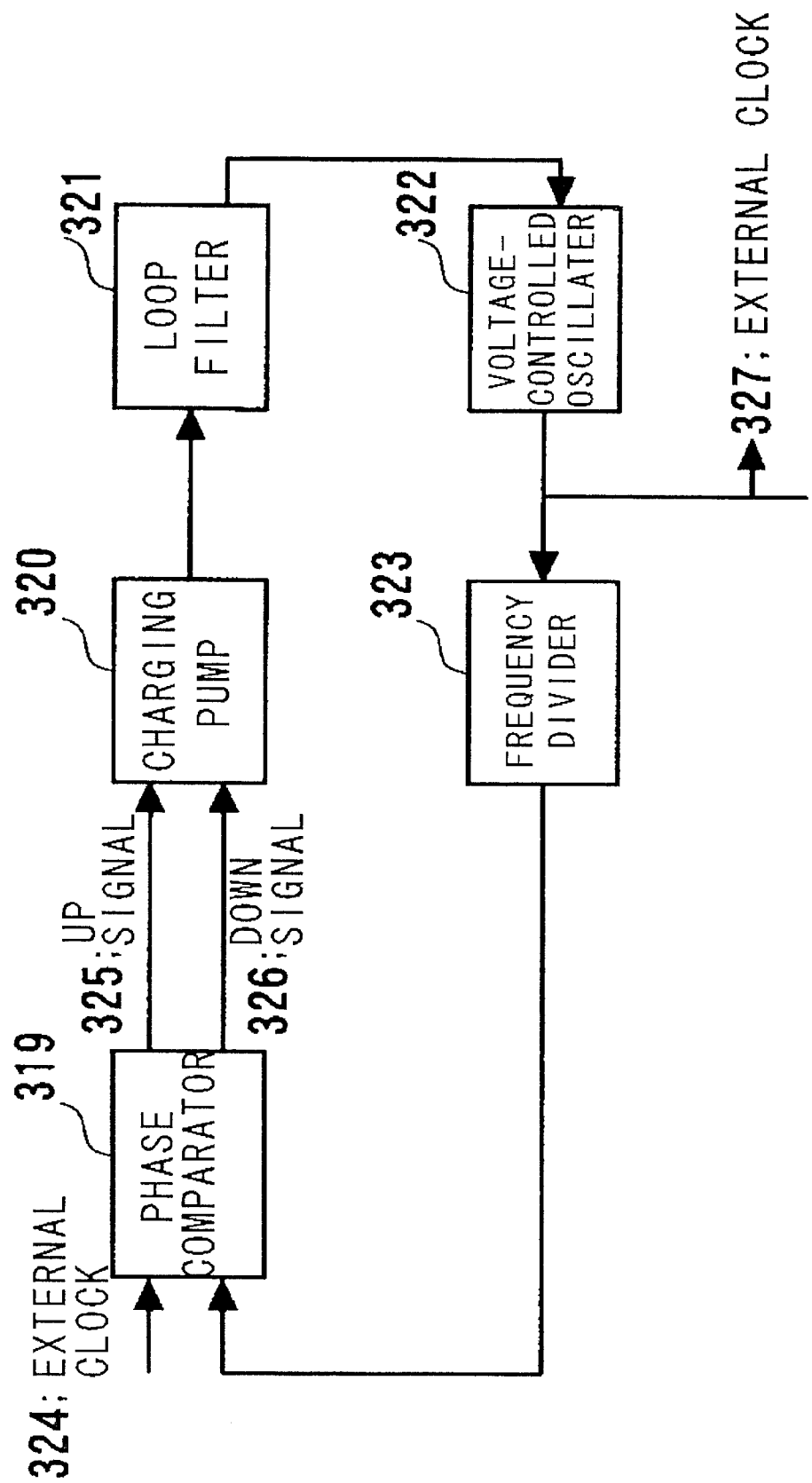
FIG. 25 is a circuit diagram showing a conventional clock signal multiplying circuit employing a PLL.

The multi-phase clock multiplying circuit includes 2n timing difference division circuits 208 to 215 (FIG. 17) each for being fed with n-phase clocks (first to nth clocks) and for outputting a signal corresponding to the division of the timing difference of two inputs. The (2I−1)st timing difference division circuit, where $1 \leq I \leq n$, is fed with the same Ith clocks as the two inputs, whilst the 2Ith timing difference division circuit, where $1 \leq I \leq n$, is fed with the Ith clock and with (I+1 mod n)th clock, as inputs, where mod denotes remainder processing and I+1 mod n means a remainder resulting from division of I+1 by m. The multi-phase clock multiplying circuit also includes 2n pulse width correction circuits 216 to 223 fed with an output of the Jth timing difference division circuit, where $1 \leq J \leq 2n$, and with an output of the (J+2mod n)th timing difference division circuit where n is a remainder obtained on dividing J+2 with n, as inputs, and n multiplexing circuits 224 to 227 each fed with an output of the Kth pulse width correction circuit, where $1 \leq K \leq n$, and with an output of the (K+n)th pulse width correction circuit, as inputs. The timing difference division circuit of the present invention is used as these timing difference division circuits.

DETAILED DESCRIPTION OF THE PREFERRED EMBODIMENTS

Referring to the drawings, a preferred embodiment of the present invention will be explained in detail.

FIG. 1a shows a structure of a timing difference division circuit embodying the present invention. The timing difference division circuit, also termed an interpolator, includes a logical circuit L1, having an input clock 1 (IN1) and an input clock 2 (IN2) as inputs, a P-channel MOS transistor MP1, having a source, a gate and a drain connected to a power source, to an output G1 (first gate signal) of the logical circuit L1 and to a node N1, respectively, and N-channel MOS transistors MN1, MN2, having drains, gates and sources connected to a common node N1, outputs G1 (first gate signal) and G2 (second gate signal) of the logical circuit L1 and to constant current sources $10_1$, $10_2$, respectively, with the node N1 being connected to an input end of the inverter INV1. The current values of the constant current sources $10_1$, $10_2$ are equal to each other and set to 1.

Figure 4:
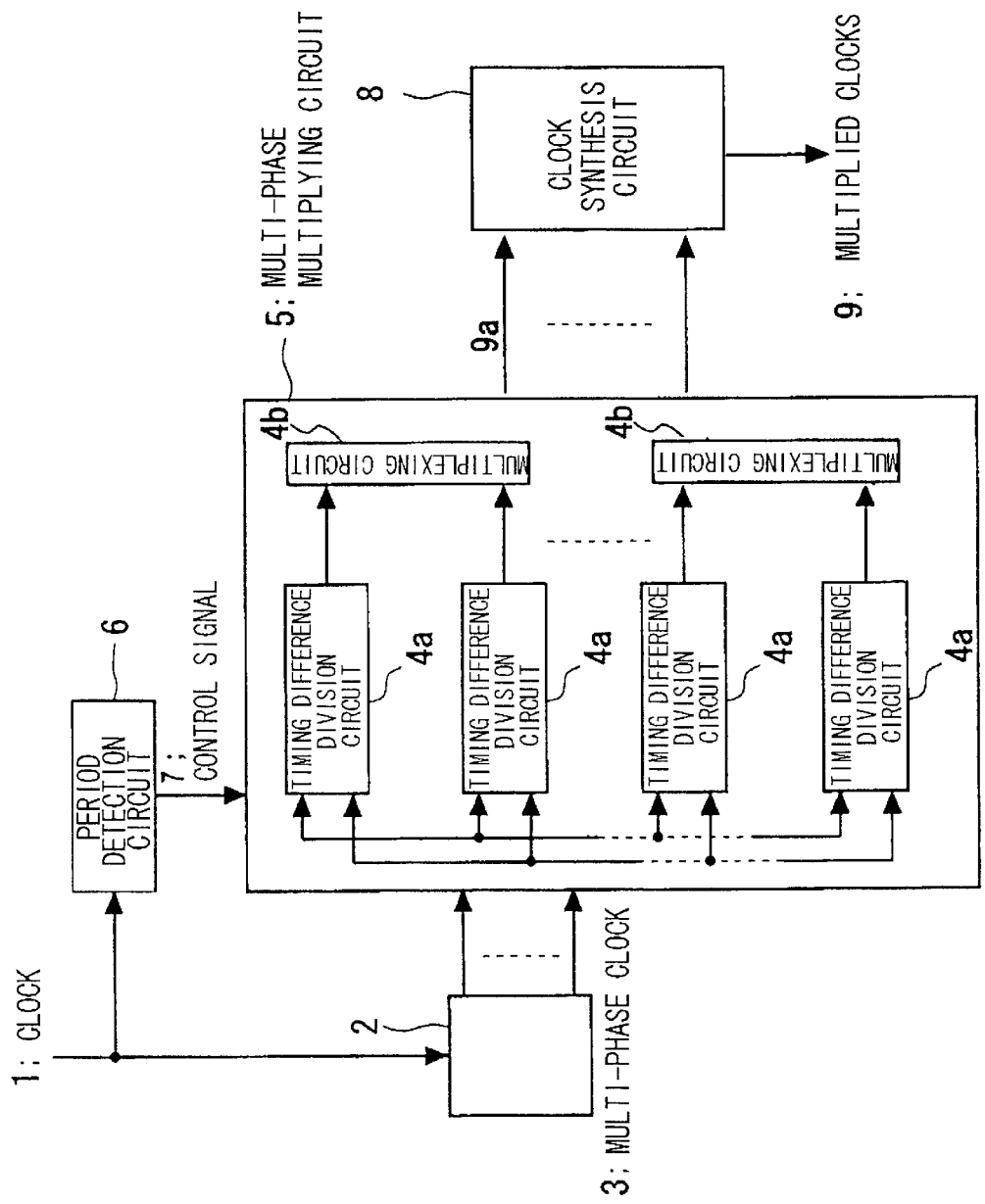
FIG. 4 shows a structure of a clock signal-controlling device shown in JP-A-11-4145.
Figure 5:
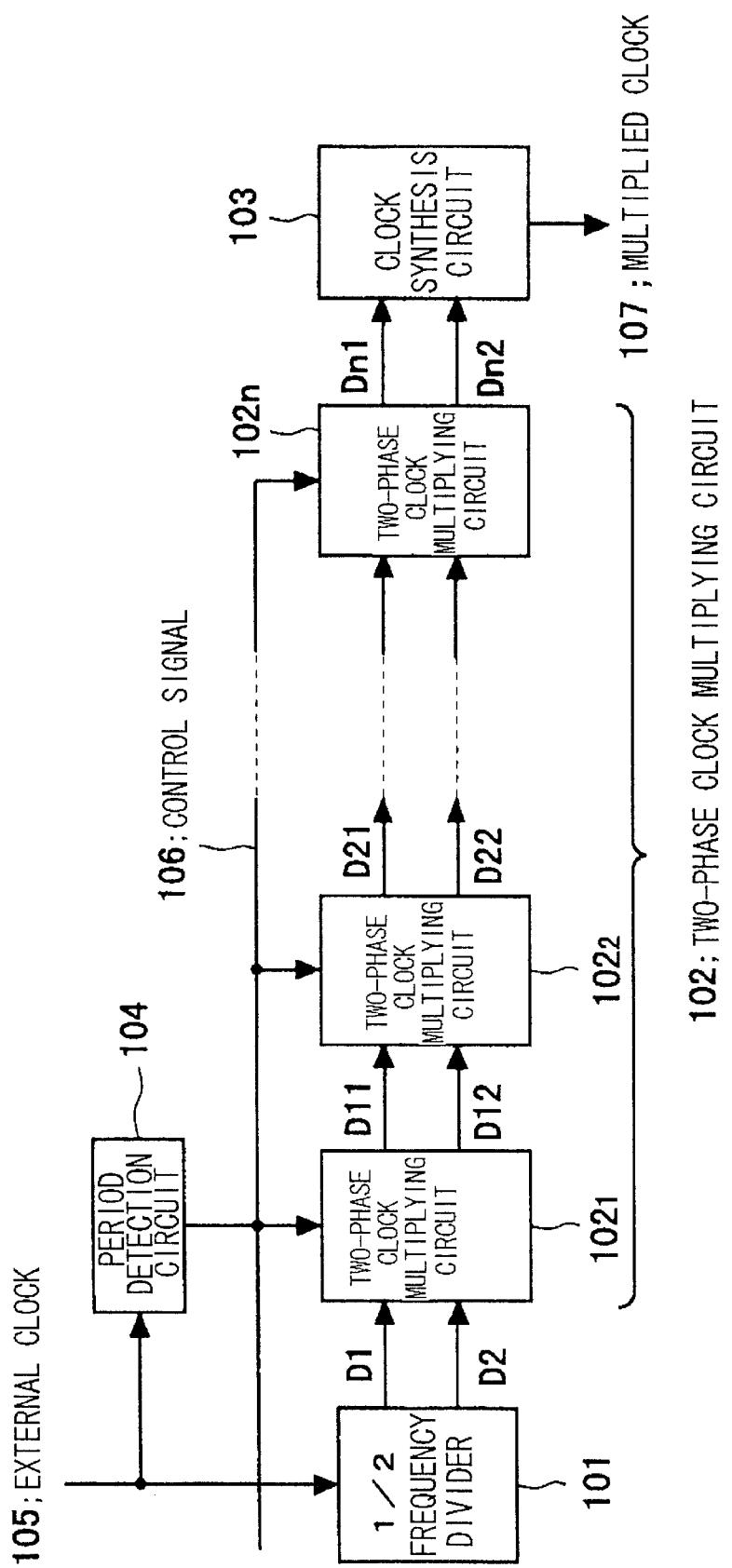
FIG. 5 similarly shows a structure of a clock signal-controlling device shown in JP-A-11-4145.
Figure 6:
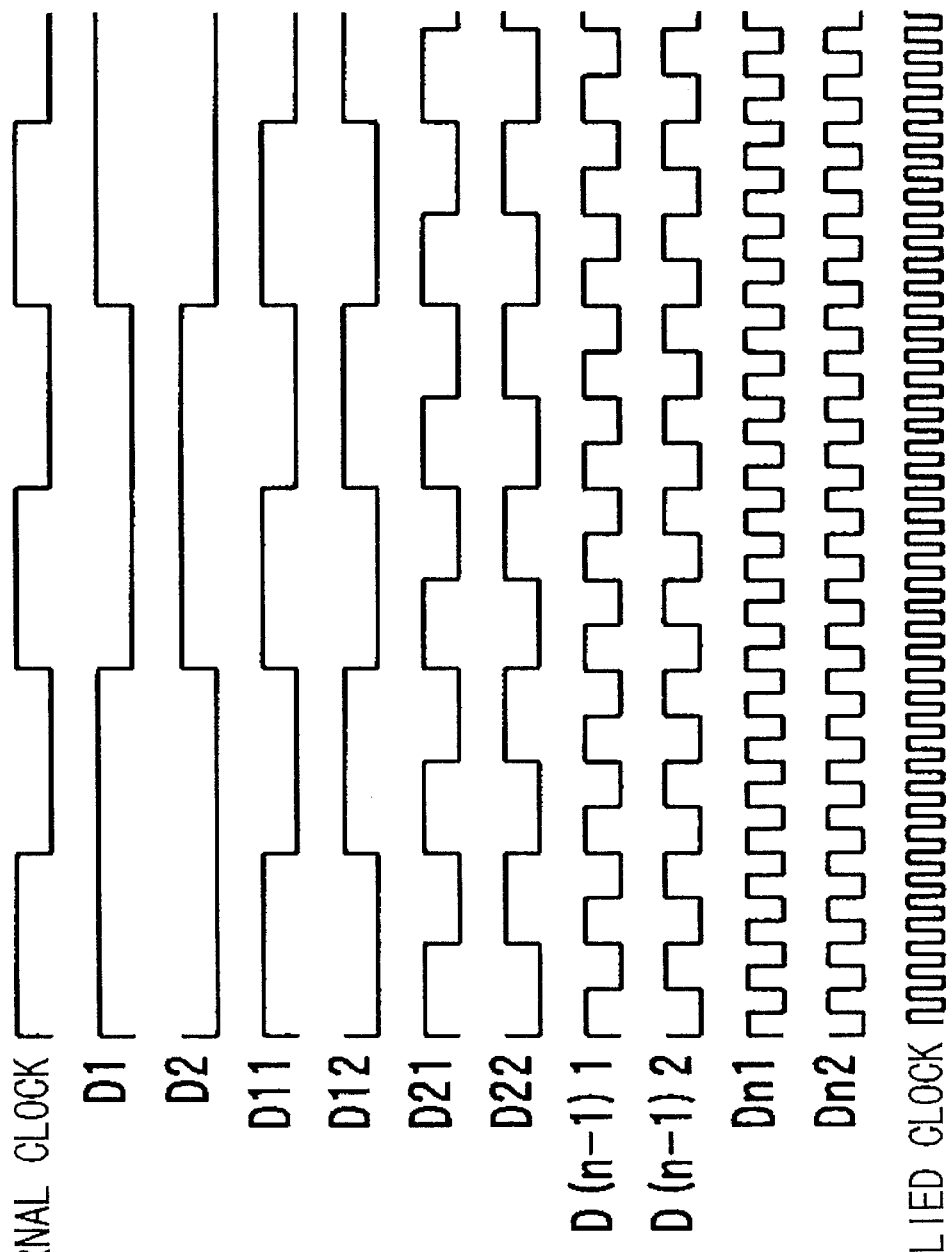
FIG. 6 is a timing chart for illustrating the operation of the clock signal-controlling device shown in JP-A-11-4145.

The timing difference division circuit also includes plural P-channel MOS transistors MP11 to MP15, having sources connected commonly, and having drain connected commonly and connected to the node N1. A control signal 7 from the period detection circuit 6 of FIG. 4 is connected to the gates of the P-channel MOS transistors MP11 to MP15. Control is made so that, if the clock period is large or small, the value of the capacitance appended (connected) to the inner node N1 is increased or decreased, respectively.

The first gate signal G1 has the timing of a beginning edge (leading edge) determined by a beginning edge of a leading phase input of two-phase inputs of the input clocks 1 and 2, while having the timing of an end edge (trailing edge) determined by the end edge of the lagging phase input.

The second gate signal G2 has a timing of a beginning edge (leading edge) determined by a beginning edge of a lagging phase input of two-phase inputs of the input clocks 1 and 2, while having the timing of an end edge (trailing edge) determined by the end edge of the lagging phase input.

An area specified by the gate length (L) or the gate width (W) of the P-channel MOS transistors MP11 to MP15 making up MOS capacitors has a ratio of 1:2:4:8:16, so that the capacitance ratio is 1:2:4:8:16. The capacitance values of the P-channel MOS transistors MP11 to MP15 are variably set by the voltage of the control signal 7.

Figure 1B:
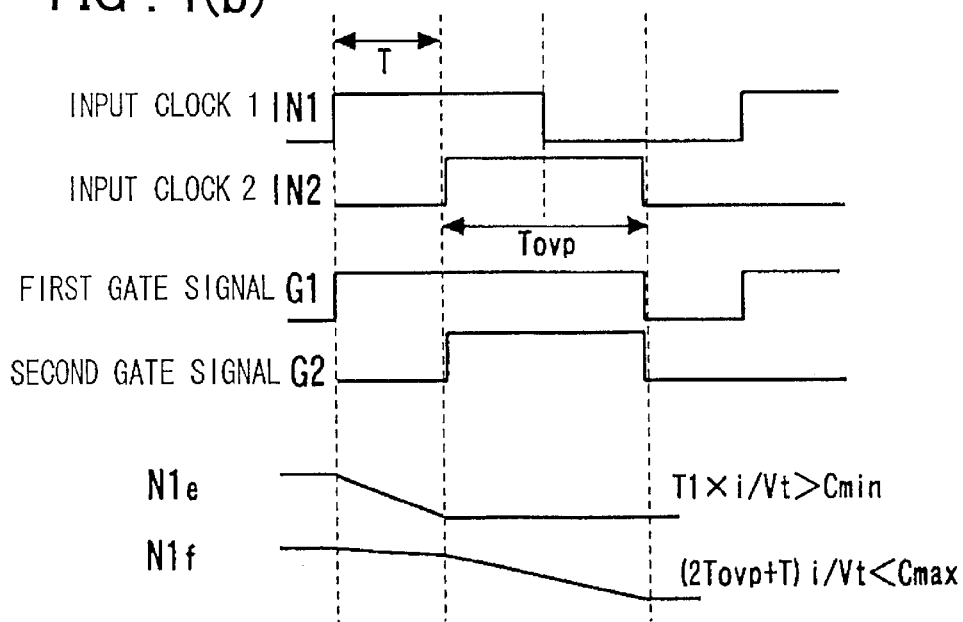

FIG. 1b shows a timing waveform for illustrating the operation of the timing difference division circuit of the embodiment of the present invention shown in FIG. 1a. Specifically, FIG. 1b shows the waveform of the input clocks 1, 2, at the input terminals IN1, IN2, generated by the logic circuit L1, first and second gate signals G1, G2 generated by the logic circuit L1 and the inner node N1. The input clocks 1, 2 are two-phase clocks, with the phase difference (timing difference) equal to T, frequency divided by a ¼ frequency diving circuit, not shown, from the four-frequency-divided signals of the clocks with the period of 4T exhibiting a phase difference of T from one another.

The first gate signal G1 has its rising edge determined by the timing of the rising edge of the input clock 1 having a leading phase, while having its falling edge determined by the timing of the falling edge of the input clock 2 with the lagging phase.

The second gate signal G2 has its rising edge determined by the timing of the rising edge of the input clock 1 having a lagging phase, while having its falling edge determined by the timing of the falling edge of the input clock 2 with the lagging phase.

FIG. 1b shows two sorts of waveforms N1e and N1f, as voltage waveforms of the inner node N1. In order for the timing of the output signal OUT to indicate a value equal to division to ½ of the phase difference of the input clocks 1 and 2, there is imposed a limitation to the value of the capacitance connected to the inner node N1.

It is noted that N1e and N1f indicate the case where the value of the capacitance connected to the inner node N1 is the minimum capacitance C min and the case where the value of the capacitance connected to the inner node N1 is the maximum capacitance C max.

First, the voltage waveform N1 of the node N1e with the minimum value of the capacitance connected to the inner node N1 is explained.

During the time of the phase difference T until the second gate signal G2 rises from the rising edge of the first gate signal G1, only the N-channel MOS transistor MN1, to the gate of which the first gate signal G1 is input, is turned on.

When the electrical charges of the inner node N1 are extracted (drawn) by the N-channel MOS transistor MN1 so that the potential of the inner node N1 reaches the threshold value Vt of the inverter INV1, an output of the inverter INV1 rises.

Assume that the electrical charge of the inner node N1, that needs to be extracted until the threshold value of the inverter INV1 is exceeded, is CV, and the current with which the electrical charges of the N-channel MOS transistor MN1 are extracted is I, the electrical charge CV is extracted with the current I as from the rising of the first gate signal G1 (voltage of the node n1 is decreased).

If the electrical charge CV is extracted during the phase difference T until the rising of the second gate signal G2 from the rising edge of the first gate signal G1, the I/2 component of the phase difference T is removed. That is, before rising of the input clock 2, an output signal is output from the timing difference division circuit (inverter INV1), that is the output rises.

So, the minimum capacitance value C which satisfies $$CV/I > T$$

represents the minimum value C min satisfying the I/2 component of the phase difference T, resulting in:

$$C\ min = T \cdot I/V.$$

Next, the voltage waveform N1f of the node N1 in case the value of the capacitance connected to the inner node N1 is the maximum C max is explained.

During the phase difference T until the second gate signal G2 rises from the rising edge of the first gate signal G1, only the N-channel MOS transistor MN1, to the gate of which the first gate signal G1 is input, is turned on. The charges of the node N1 are extracted by the N-channel MOS transistor MN1. Then, by the rising of the second gate signal G2, the charge of the node N1 is extracted by the N-channel MOS transistors MN1, MN2. That is, the voltage of the node N1 is lowered. When the potential of the node N1 reaches the threshold value Vt, an output rises from the inverter INV1.

Assume that the electrical charge of the node N1, that needs to be extracted until the threshold value Vt of the inverter INV1 is exceeded, is CV, and the current with which the electrical charge of the N-channel MOS transistors MN1 and MN2 is I, the electrical charge CV is extracted with the current I of the N-channel MOS transistor MN1 during the phase difference T as from the rising of the first gate signal G1 to the rising of the second input signal IN2, and thereafter with the current 2I.

The time during which the charge is extracted with the current 2I is an overlap period Tovp of the first and second gate signals G1 and G2. If the charge CV is not completely extracted during this overlap period Tovp, the I/2 component of the phase difference T is depleted in the output of the timing difference division circuit. So, the maximum capacitance value C which satisfies:

$$(CV - T \cdot I)/2I < Tovp$$

is the maximum value C max satisfying the I/2 component of the phase difference T. That is:

$$C\ max = (2Tovp + T)I/V.$$

In an embodiment of the present invention, the size of C max can be adjusted by adjusting the length of the overlap period Tovp of the first and second gate signals G1, G2 by the logic circuit L1.

Figure 26:
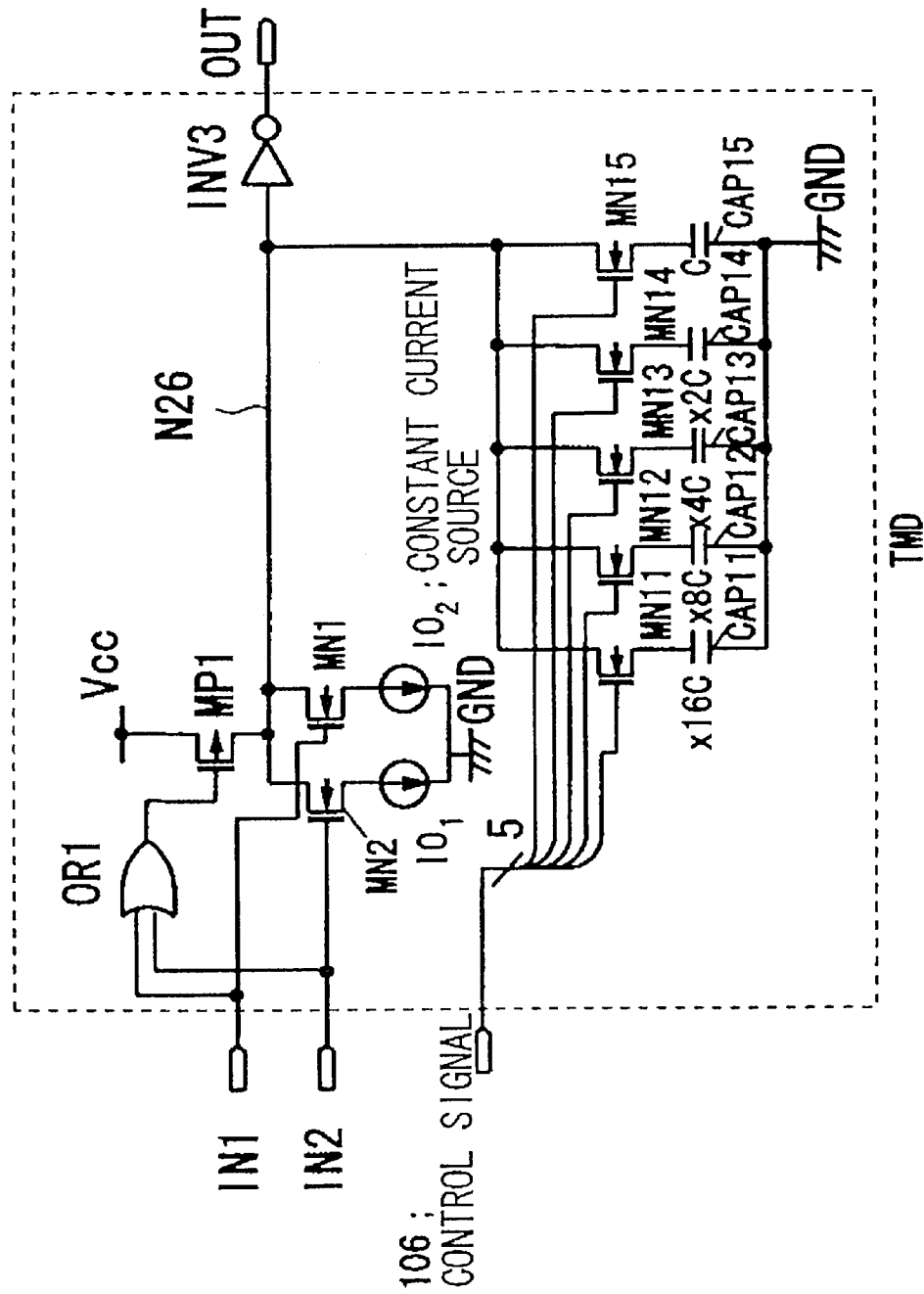
FIG. 26 shows a typical circuit configuration of a conventional timing difference division circuit (interpolator).
Figure 28A:
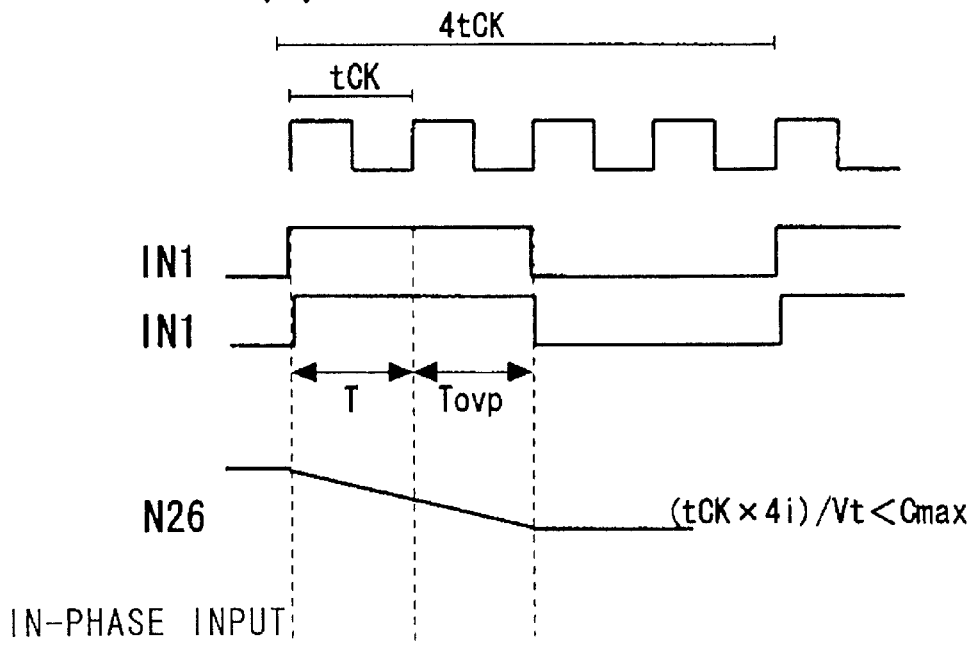
FIG. 28(a) and FIG. 28(b) show timing charts for illustrating the operation of the conventional timing difference division circuit shown in FIG. 26.
Figure 28B:
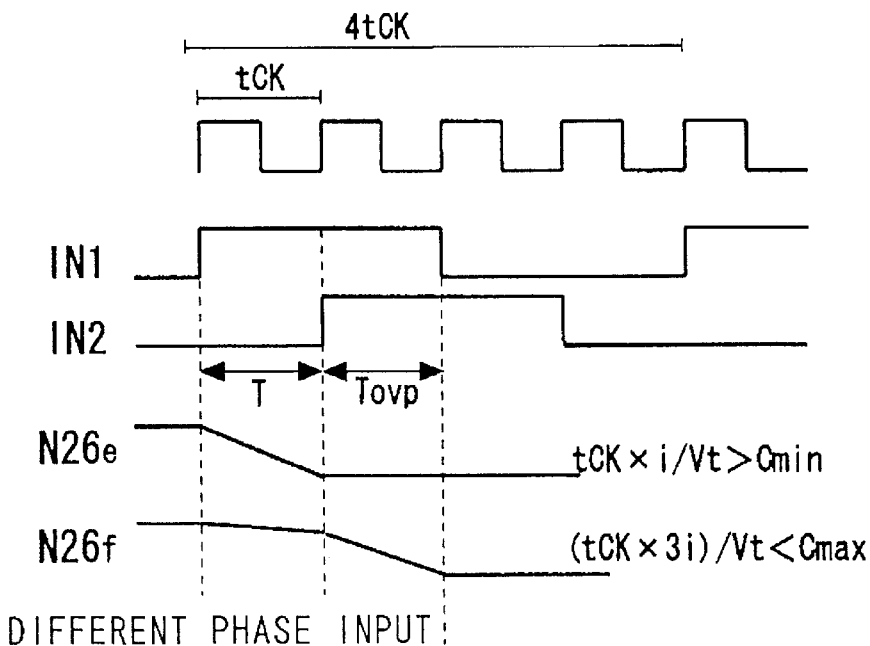
Figure 29:
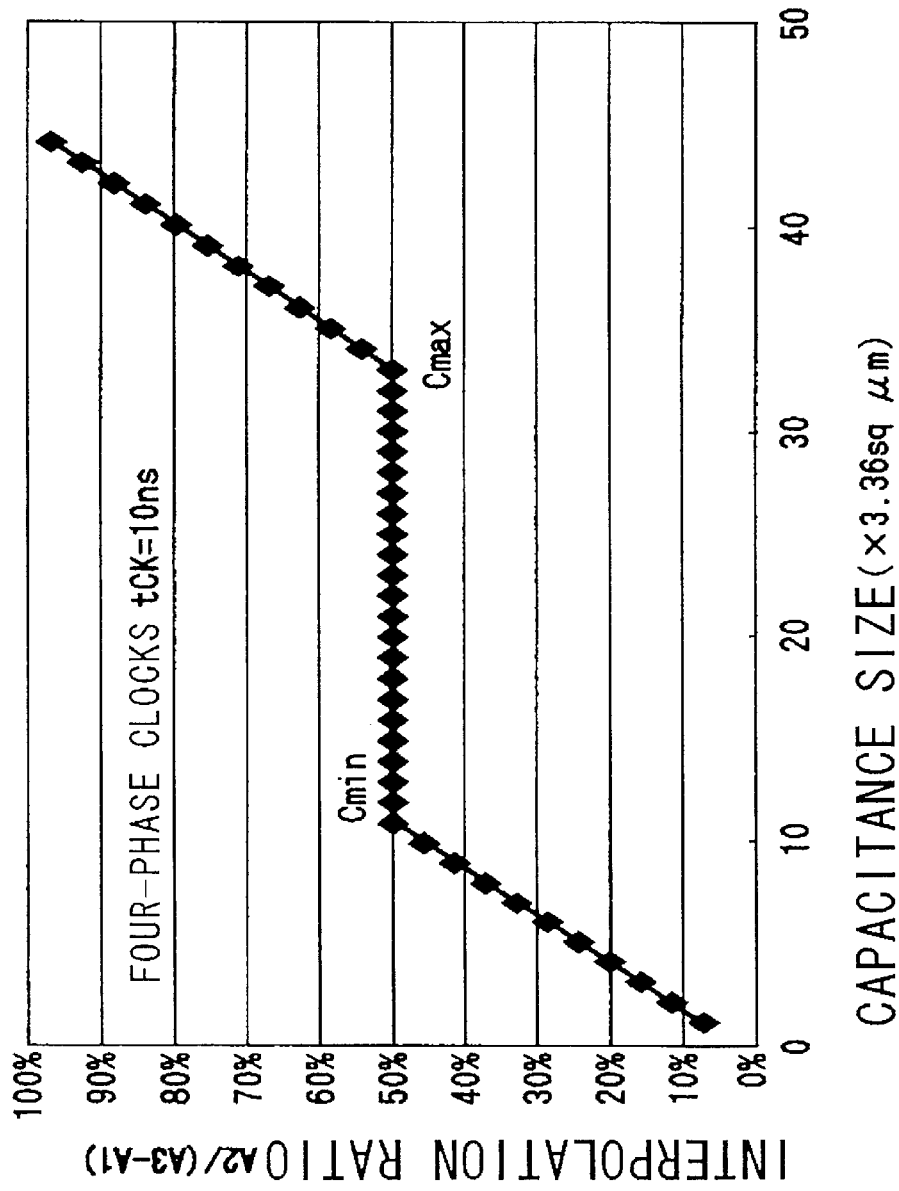
FIG. 29 shows a typical relation between the capacitance value and the ratio of interior division in the conventional timing difference division circuit.

Moreover, by connecting the sources and drains of the commonly to the P-channel MOS transistors MP11 to MP15 to the node N1, the variable capacitance can be constructed without the necessity of providing the MOS transistor switches (MN11 to MN14) and capacitors (CAP11 to CAP15) shown in FIG. 26 etc., thus reducing the chip area.

Figure 2A:
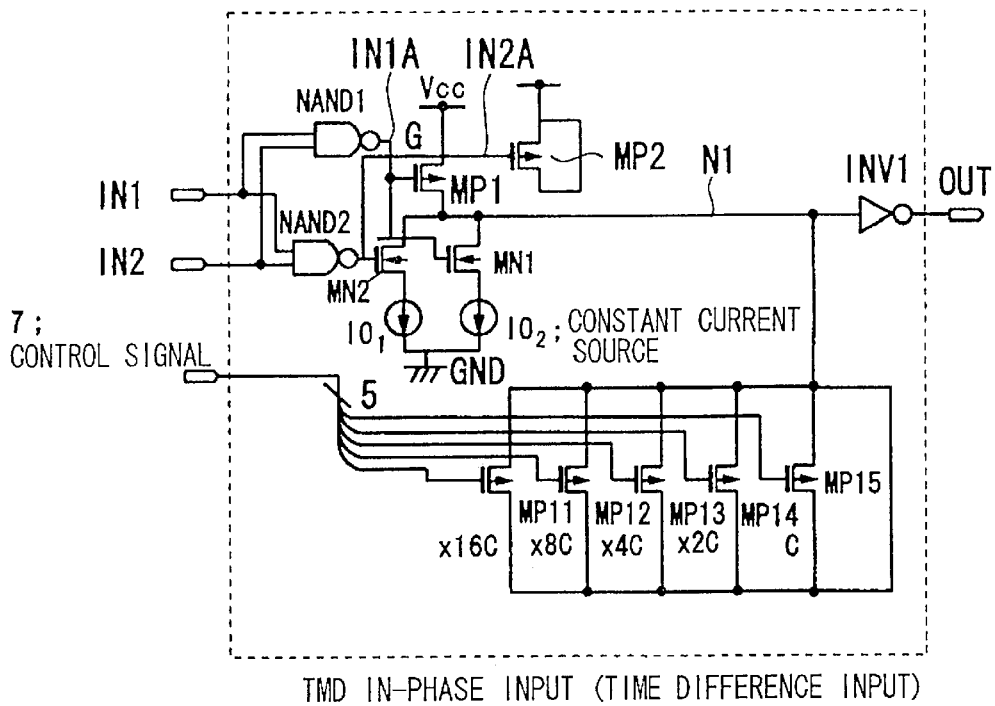
FIG. 2a shows a structure of another embodiment of the present invention and FIG. 2b is a timing diagram showing the operation.
Figure 2B:
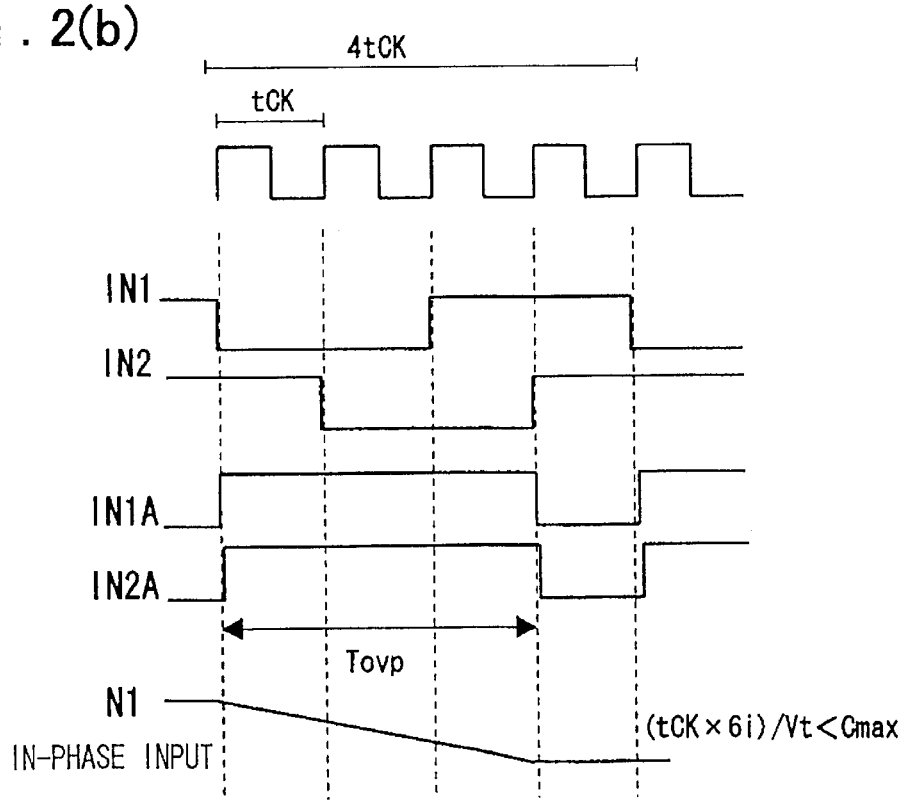
Figure 3A:
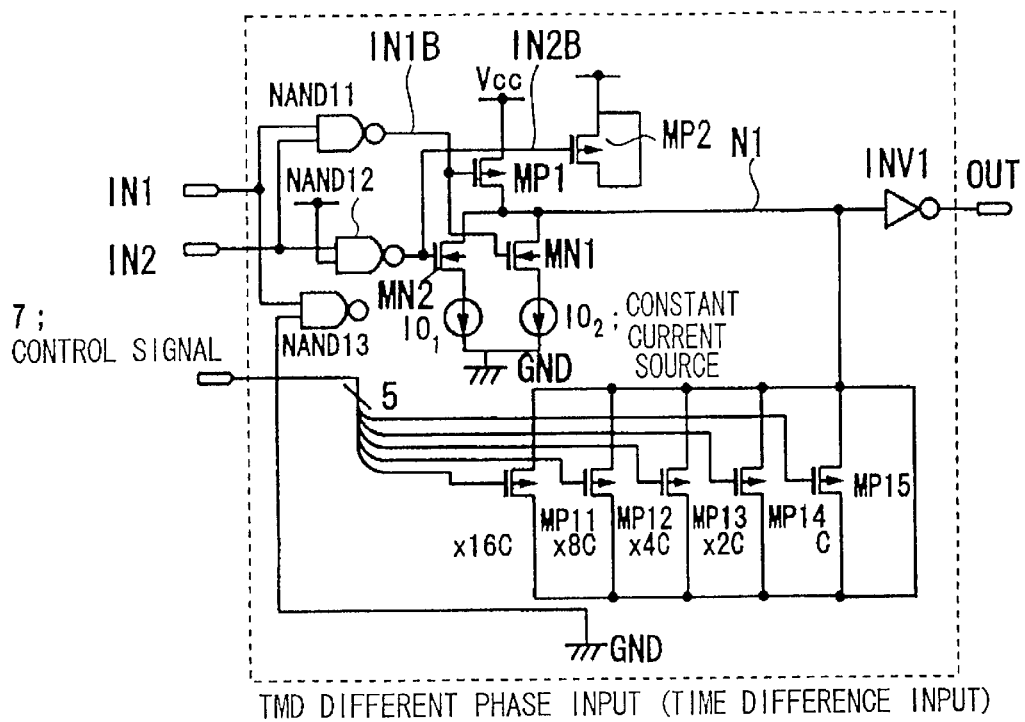
FIG. 3a shows a structure of still another embodiment of the present invention and FIG. 3b is a timing diagram showing the operation.
Figure 3B:
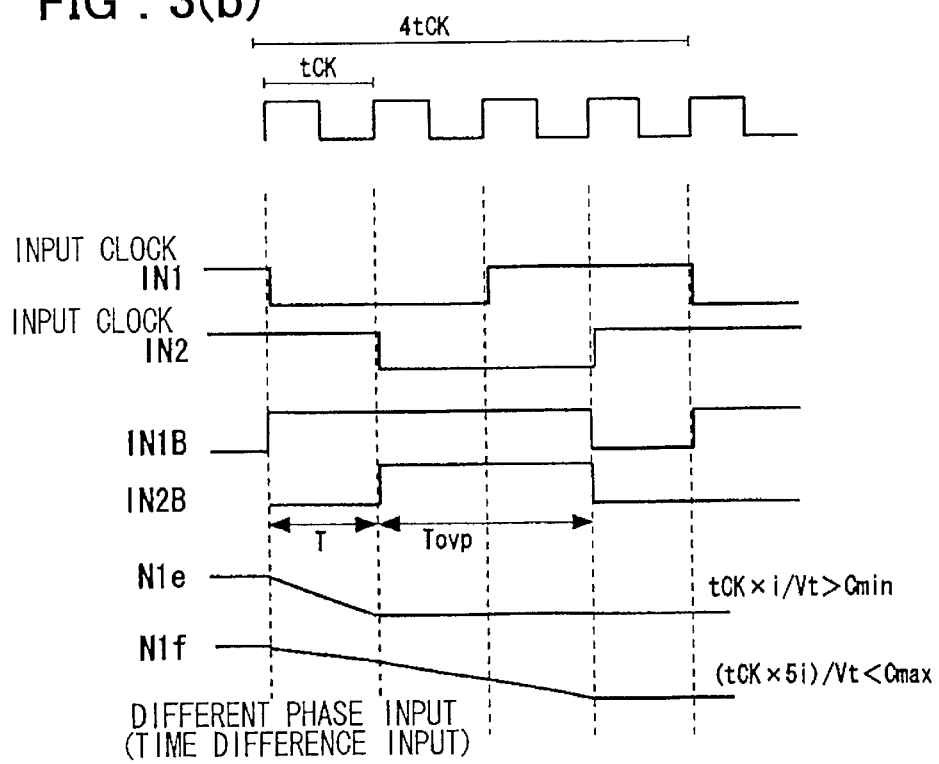

FIGS. 2 and 3 show a structure of an embodiment of the present invention. In the present embodiment, shown in FIGS. 2 and 3, the circuit for controlling the overlap of the input clocks is constructed using circuits of the same phase input and circuits of the different phase input using NAND devices. The inputs are four-phase clock inputs. Meanwhile, in FIGS. 2 and 3, the input signals are signals IN1 and IN2 having timing differential. The constant current sources $10_1$, $10_2$ are of an equal current value I.

In FIG. 2a, by way of the logic circuit L1, the circuit for generating a first gate signal IN1A from the inputs IN1, IN2 is a NAND circuit NAND1, whilst the circuit for generating a second gate signal IN2A from the inputs IN1, IN2 is a NAND circuit NAND2. To the gate signal IN2A is connected a MOS capacitor device MP2 to counterbalance the first gate signal IN1A and the load.

Referring to FIG. 2b, the first and second gate signals IN1, IN2 are high as from the falling edge of the signal IN1 until the rising edge of the signal IN2, with the overlap period Tovp being 3tCK. The N-channel MOS transistors MN1, MN2 are turned on to extract electrical charge at the current 2I. If, during this time period, the rising edge of the output signal of the inverter INV1 is to exist, $$CV/2I < 3tCK$$

$$C \max = tCK \cdot 6I/V$$

where CV denotes electrical charge to be extracted until reaching the threshold value voltage of the inverter INV1.

Referring to FIG. 3a, the logic circuit L1 includes a NAND circuit NAND11, as a circuit for generating the first gates signal IN1B from the first and second inputs IN1, IN2 as inputs of different phases. The logic circuit L1 also includes a NAND circuit NAND12, fed with the second input IN2 and with a fixed high value as inputs, as a circuit for generating the second gate signal IN2B. To the second gate signal IN2B is connected a MOS capacitor device MP2 for counterbalancing the first gate signal IN1B and the load. The NAND circuit NAND13 is fed as input with the input IN1 and with the ground potential to counterbalance the loads of the inputs 1 and 2.

If the N-channel MOS transistor MN1 is fired by the first gate signal IN1B and the electrical charge CV of the inner node N1, where C is the load capacitance of the inner node and V is the threshold value voltage Vt of the inverter, is extracted within tCK=T, the divided component of the I/2 component with the timing difference T ceases to exist in an output of the timing difference division circuit. So, the following holds:

$$CV/I < tCK$$

$$C \min = tCK \cdot I/V.$$

If, in the case of the different phase input, the N-channel MOS transistors MN1, MN2 are turned ON during the overlap period Tovp of the first gate signal IN1B and the second gate signal IN2B to extract the electrical charge CV from the inner node N1 with the current 2I, the divided component as the I/2 component, with the timing difference T, exists in the output of the timing difference division circuit. So, the following holds:

$$(CV - tCK \cdot I)/2I < 2tCK$$

$$C \max > (tCK \cdot 5I)/Vt.$$

The capacitance value with which the timing difference division circuit is able to provide timing with the interior division ratio of ½ of the timing difference is 1:5 from the minimum value to the maximum value. This indicates marked improvement over the conventional value of 1:3 thereby enhancing the range of the operating frequency.

In the above-described embodiment, an interpolator in which the N-channel MOS transistors MN1, MN2 are arranged in parallel with each other, is used in a discharge path of the inner node. Alternatively, the polarity may also be reversed using P-channel MOS transistors. In this case, the inner node N1 is charged instead of being discharged by the first and second gate signals output from the logic circuit L1 fed with the input signals IN1 and IN2.

The above-described timing difference division circuit may be used with advantage in a timing difference division circuit in the clock control circuit shown in FIGS. 4 to 7 and 15 to 17. Although four-phase clocks are used in the above-described embodiment, eight phase or sixteen phase signals, for example, may, of course, be used.

A wide variety of circuits may be formed by the combination of e.g., NAND circuits as the logic circuit L1 used for generating gate signals. Alternatively, a circuit for producing one-shot signals may lengthen the overlap period.

Although the present invention has been described with reference to the above-described embodiments, it is to be noted that the present invention may comprise a variety of modifications that may be within the reach of those skilled in the art from the teaching of the invention as disclosed in the claims.

The meritorious effects of the present invention are summarized as follows.

According to the present invention, in which, in a timing difference division circuit (interpolator) for outputting a signal having delay time corresponding to the division by a preset interior dividing ratio of the timing difference of an input signal, there is provided a circuit for controlling the on/off time of a switch for controlling the signal rising and decay at the internal node, it is possible to enlarge the range of the value of the capacitance appended to the inner node thus increasing the operating range by a simplified logic circuit.

Moreover, according to the present invention, in which the capacitances and switches for controlling the connection of the capacitance to the inner node is removed by replacing the capacitances by MOS capacitors, it is possible to suppress or decrease the chip area.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items might fall under the modifications aforementioned.

What is claimed is:

1. A timing difference division circuit comprising:

two switches connected in parallel to control a path between an inner node and a power source;

one of said switches being turned on based on a first input signal undergoing transition to charge or discharge at least one MOS capacitor device that connects said inner node with a first constant current source;

the other said switch being turned on based on a second input signal undergoing transition with a delay with respect to said first input signal, said at least one MOS capacitor device connected to said inner node being charged or discharged through said one switch in the on-state and the other switch in the on-state with a current value corresponding to a sum of said first constant current source and a second constant current source;

wherein the output of the circuit is directed through a buffer circuit which has an output logic value that is changed when the voltage of said inner node exceeds or is smaller than a predetermined threshold value;

said timing difference division circuit further utilizing a predetermined overlap period (Tovp), during which an on time period of said one switch is overlapped with an on time period of said other switch.

2. The timing difference division circuit as defined in claim 1 wherein said overlap period (Tovp) is lengthened forwardly of a leading edge of said second signal undergoing transition with a delay with respect to said first signal, or said overlap period (Tovp) begins at the leading edge of said other signal and is lengthened rearwardly of a trailing edge of said first signal.

3. The timing difference division circuit as defined in claim 1 wherein said overlap period (Tovp) begins at the forward edge of said second signal undergoing transition with a delay from said first signal and to end at the trailing edge of said second signal.

4. The timing difference division circuit as defined in claim 1 wherein a connection of said at least one MOS capacitor device to said inner node is separately controlled by a control signal.

5. The timing difference division circuit as defined in claim 4 wherein said at least one MOS capacitor device comprises a plurality of MOS capacitor devices, wherein the capacitance values of said MOS capacitor devices differ from one another.

6. The timing difference division circuit as defined in claim 4 wherein said at least one MOS capacitor device comprises a plurality of MOS capacitor devices having sources and drains connected to said inner node and having respectively different gate lengths or gate widths.

7. A timing difference division circuit comprising:

a logic circuit generating and outputting a first gate signal and a second gate signal based on a first input signal and a second input signal; and a first switch element connected across a first power source and an inner node and having a control terminal to which is fed said first gate signal;

a first series circuit comprising a second switch element and a first constant current source; and a second series circuit comprising a third switch element and a second constant current source, said first and second series circuits being connected in parallel across said inner node and a second power source;

said first and second gate signals being connected to control terminals of said second and third switches, respectively;

said timing difference division circuit further comprising:

a plurality of MOS capacitors, connection of which to said inner node is separately controlled by a control signal; and a buffer circuit, an input end of which is connected to said inner node and the value of an output signal of which is determined based on the relative magnitude of a potential of said inner node and a threshold voltage;

wherein an overlap period, during which said first and second gate signals output from said logic circuit are both activated to turn on said second and third switch elements, is set to a predetermined value.

8. The timing difference division circuit as defined in claim 7 wherein said logic circuit outputs as said first gate signal a signal that has a leading edge determined by the beginning edge of the first input signal, and an end edge that is determined by an end edge of a second lagging input signal;

said logic circuit outputting, as said second gate signal, a signal that has a leading edge determined by the beginning edge of the first input signal, and an end edge that is determined by an end edge of the second lagging input signal.

9. The timing difference division circuit as defined in claim 7 wherein said logic circuit outputs, as said first and second gate signals, an in-phase signal having a leading edge timing determined by a leading edge of one of the first and second input signals having a leading phase, said in-phase signal having an end edge timing determined by an end edge of the input signal having a lagging phase.

10. A timing difference division circuit comprising:

a logic circuit generating and outputting a first gate signal and a second gate signal based on a first input signal and a second input signal;

a first MOS transistor of a first conductivity type, having a source, a drain and a gate connected to a first power source, an inner node and to said first gate signal, respectively;

second and third MOS transistors of a second conductivity type having drains commonly connected to said inner node and to the gates of which said first and second gate signals are connected;

a first constant current source and a second constant current source connected across a source of said second MOS transistor and a second power source and across a source of the third MOS transistor and the second power source, respectively;

a plurality of MOS transistors of the first conductivity type, having sources and drains connected to said inner node and to the gates of which control signals are connected; and a buffer circuit, an input end of which is connected to said inner node and the value of an output signal of which is determined based on the relative magnitude of the potential of said inner node and a threshold voltage;

wherein an overlap period, during which said first and second gate signals output from said logic circuit are both activated to turn on said second and third MOS transistors simultaneously, is set to a predetermined value.

11. The timing difference division circuit as defined in claim 10 wherein said logic circuit outputs as said first gate signal a signal that has a leading edge determined by the beginning edge of the first input signal, and an end edge that is determined by an end edge of a second lagging input signal;

said logic circuit outputting, as said second gate signal, a signal that has a leading edge determined by the beginning edge of the first input signal, and an end edge that is determined by an end edge of the second lagging input signal.

12. The timing difference division circuit as defined in claim 10 wherein said logic circuit outputs, as said first and second gate signals, an in-phase signal having a leading edge timing determined by a leading edge of one of the first and second input signals having a leading phase, said in-phase signal having an end edge timing determined by an end edge of the input signal having a lagging phase.

13. The timing difference division circuit as defined in claim 10 wherein
  said first and second input signals are made up of clocks of respectively different phases generated on frequency division of input clock signals; and
  at least one said control signal is supplied from a circuit detecting the period of said clocks.

14. A timing difference division circuit comprising:
  a logic circuit generating and outputting a first gate signal and a second gate signal based on a first input signal and a second input signal; and
  a first switch element connected across a first power source and an inner node and having a control terminal to which is fed said first gate signal;
  a first series circuit comprising a second switch element and a first constant current source; and
  a second series circuit comprising a third switch element and a second constant current source, said first and second series circuits being connected in parallel across said inner node and a second power source;
  said first and second gate signals being connected to control terminals of said second and third switches, respectively;
  said timing difference division circuit further comprising:
    a plurality of MOS capacitors, connection of which to said inner node is separately controlled by a control signal; and
    a buffer circuit, an input end of which is connected to said inner node and the value of an output signal of which is determined based on the relative magnitude of a potential of said inner node and a threshold voltage;
  wherein an overlap period, during which said first and second gate signals output from said logic circuit are both activated to turn on said second and third switch elements, is set to a predetermined value wherein
    said logic circuit includes a first gate circuit outputting a first value as said first gate signal when said first and second input signals assume first and second values, respectively, or when both said input signals assume the second value such that both said input signals assume values other than the first value; and
    said logic circuit further includes a second gate circuit outputting a first value as said second gate signal when the input signal having a lagging phase assumes a second value.

15. A timing difference division circuit comprising
  a logic circuit generating and outputting a first gate signal and a second gate signal based on a first input signal and a second input signal;
  a first MOS transistor of a first conductivity type, having a source, a drain and a gate connected to a first power source, an inner node and to said first gate signal, respectively;
  second and third MOS transistors of a second conductivity type having drains commonly connected to said inner node and to the gates of which said first and second gate signals are connected;
  a first constant current source and a second constant current source connected across a source of said second MOS transistor and a second power source and across a source of the third MOS transistor and the second power source, respectively;
  a plurality of MOS transistors of the first conductivity type, having sources and drains connected to said inner node and to the gates of which control signals are connected; and
  a buffer circuit, an input end of which is connected to said inner node and the value of an output signal of which is determined based on the relative magnitude of the potential of said inner node and a threshold voltage;
  wherein an overlap period, during which said first and second gate signals output from said logic circuit are both activated to turn on said second and third MOS transistors simultaneously, is set to a predetermined value wherein
    said logic circuit includes a first gate circuit outputting a first value as said first gate signal when said first and second input signals assume first and second values, respectively, or when both said input signals assume the second value such that both said input signals assume values other than the first value; and
    said logic circuit further includes a second gate circuit outputting a first value as said second gate signal when the input signal having a lagging phase assumes a second value.

16. A clock controlling circuit for generating and outputting multi-phase clocks on frequency division of input clocks, said clock controlling circuit comprising:
  a frequency divider generating and outputting multi-phase clocks by frequency-dividing an input clock;
  a period detection circuit for detecting the period of said input clock; and
  a multi-phase multiplying circuit being fed as input with multi-phase clocks output from said frequency divider to generate multi-phase clocks multiplied from said clocks;
  wherein said multi-phase multiplying circuit includes:
    a plurality of timing difference division circuits outputting a signal corresponding to division of the timing difference of two input signals as defined in claim 1, and
    a plurality of multiplexing circuits multiplexing and outputting output signals of two of said timing difference division circuits.

17. The clock controlling circuit as defined in claim 16 further comprising a two-phase clock multiplying circuit, wherein said two-phase clock multiplying circuit includes:
  four said timing difference division circuits being fed with two-phase clocks and outputting a signal corresponding to division of the timing difference of two input signals, and
  two multiplexing circuits, one being fed with the output signals of the first and third said timing difference division circuits, and the other being fed with the output signals of the second and fourth said timing difference division circuits.

18. The clock controlling circuit as defined in claim 16 wherein
  said multi-phase clock multiplying circuit includes
    (a) 2n of said timing difference division circuits, each being fed with n-phase clocks (first to nth clocks) and outputting a signal corresponding to the division of the timing difference of two input signals;
      wherein the 2I−1st timing difference division circuit, where $1 \leq I \leq n$, is fed with the same Ith clock as said two inputs;
      wherein the 2Ith timing difference division circuit, where $1 \leq I \leq n$, is fed with the Ith clock and (I+1 mod n)th clock, as inputs, where "mod" denotes remainder processing and I+1 mod n means a remainder resulting from division of I+1 by n;

(b) 2n pulse width correction circuits fed with an output of the Jth said timing difference division circuit, where 1≦J≦2n, and with an output of the (J+2mod n)th said timing difference division circuit, where n is a remainder obtained on dividing J+2 with n, as inputs; and (c) n multiplexing circuits fed each with an output of the Kth said pulse width correction circuit, where 1≦K≦n, and with an output of the (K+n)th pulse width correction circuit, as inputs.

19. A clock controlling circuit for generating and outputting multi-phase clocks on frequency division of input clocks, said clock controlling circuit comprising:

a frequency divider generating and outputting multi-phase clocks by frequency-dividing an input clock;

a period detection circuit for detecting the period of said input clock; and a multi-phase multiplying circuit being fed as input with multi-phase clocks output from said frequency divider to generate multi-phase clocks multiplied from said clocks;

wherein said multi-phase multiplying circuit includes:

a plurality of timing difference division circuits outputting a signal corresponding to division of the timing difference of two input signals as defined in claim 7, and a plurality of multiplexing circuits multiplexing and outputting the output signals of two of said timing difference division circuits.

20. A clock controlling circuit for generating and outputting multi-phase clocks on frequency division of input clocks;

said clock controlling circuit comprising:

a frequency divider generating and outputting multi-phase clocks by frequency-dividing an input clock;

a period detection circuit for detecting the period of said input clock; and a multi-phase multiplying circuit being fed as input with multi-phase clocks output from said frequency divider to generate multi-phase clocks multiplied from said clocks;

wherein said multi-phase multiplying circuit includes:

a plurality of timing difference division circuits outputting a signal corresponding to division of the timing difference of two input signals as defined in claim 10, and a plurality of multiplexing circuits multiplexing and outputting the output signals of two of said timing difference division circuits.

21. A signal controlling method for adjusting the timing difference division circuit as defined in claim 1 comprising:

adjusting said overlap period (Tovp) so as to enlarge the range of the charge of said MOS capacitor device connected to said inner node with respect to the divided value of the timing difference of the two input timing signals.

22. The signal controlling method as defined in claim 21 wherein said overlap period (Tovp) is adjusted by either extending the leading edge of said second input signal or by beginning the overlap period (Tovp) at the leading edge of said second input signal and extending the trailing edge of said first input signal.

23. The signal controlling method as defined in claim 21 wherein said overlap period (Tovp) is caused to begin at the forward edge of said second input signal and to end at the trailing edge of said other signal.

24. A signal controlling method in which first and second input signals, with respective different phases, are input, and an output signal of a delay time is determined by a time resulting from division of a timing difference between said two input signals, said method comprising:

generating, from said first and second input signals, a first gate signal and a second gate signal;

determining the timing of a beginning edge of the first gate signal based on a beginning edge of one of the first and second input signals having a leading phase, and determining the timing of an end edge of the first gate signal by an end edge of the input signal having a lagging phase; and determining the timing of a beginning edge of the second gate signal by a beginning edge of one of the first and second input signals having a lagging phase, and determining the timing of an end edge of the second gate signal by an end edge of the input signal having the lagging phase;

first charging or discharging the capacitance of said inner node by one of first and second switch elements connected across the inner node and a power source, said one being turned on based on said first gate signal;

subsequently charging or discharging the capacitance of said inner node by said switch element being turned on based on said second gate signal in conjunction with said switch element being turned on based on said second gate signal; and outputting an output signal from a buffer circuit to an input end of which said inner node is connected and an output logic value of which is changed in a case where said inner node voltage exceeds or is smaller than a threshold value, said output signal including a time resulting from division of the timing difference of the first and second input signals.

* * * * *